US011133468B2

(12) United States Patent
Chang et al.

(10) Patent No.: US 11,133,468 B2
(45) Date of Patent: Sep. 28, 2021

(54) SEMICONDUCTOR NANOCRYSTAL-LIGAND COMPOSITE AND DEVICE INCLUDING COMPOSITE

(71) Applicant: SAMSUNG ELECTRONICS CO., LTD, Suwon-si (KR)

(72) Inventors: Jaejun Chang, Gwacheon-si (KR); O Hyun Kwon, Seoul (KR); Tae Hyung Kim, Seoul (KR); Jhun Mo Son, Yongin-si (KR); Sang Jin Lee, Seoul (KR); Eun Joo Jang, Suwon-si (KR); Dae Young Chung, Suwon-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 272 days.

(21) Appl. No.: 16/451,443

(22) Filed: Jun. 25, 2019

(65) Prior Publication Data

US 2019/0393418 A1 Dec. 26, 2019

(30) Foreign Application Priority Data

Jun. 25, 2018 (KR) ........................ 10-2018-0072945

(51) Int. Cl.
| | | |
|---|---|---|
| *H01L 51/00* | (2006.01) | |
| *H01L 51/50* | (2006.01) | |
| *C09K 11/88* | (2006.01) | |
| *C09K 11/02* | (2006.01) | |
| *C09K 11/66* | (2006.01) | |
| *C09K 11/74* | (2006.01) | |
| *C09K 11/59* | (2006.01) | |
| *C09K 11/65* | (2006.01) | |
| *C09K 11/08* | (2006.01) | |
| *B82Y 30/00* | (2011.01) | |

(52) U.S. Cl.
CPC ........ *H01L 51/0045* (2013.01); *C09K 11/025* (2013.01); *C09K 11/59* (2013.01); *C09K 11/65* (2013.01); *C09K 11/66* (2013.01); *C09K 11/7492* (2013.01); *C09K 11/883* (2013.01); *C09K 11/885* (2013.01); *H01L 51/0059* (2013.01); *H01L 51/502* (2013.01); *B82Y 30/00* (2013.01); *C09K 11/08* (2013.01)

(58) Field of Classification Search
CPC ....... C09K 11/025; C09K 11/59; C09K 11/65; C09K 11/66; C09K 11/883; C09K 11/885; C09K 11/7492; B92Y 30/00; H01L 51/502
See application file for complete search history.

(56) References Cited

U.S. PATENT DOCUMENTS

| | | | |
|---|---|---|---|
| 9,263,682 | B2 | 2/2016 | Harada et al. |
| 2015/0311289 | A1 | 10/2015 | Sellinger et al. |

FOREIGN PATENT DOCUMENTS

| | | |
|---|---|---|
| CN | 103043718 A | 4/2013 |
| CN | 103058274 A | 4/2013 |
| CN | 105185918 A | 12/2015 |
| JP | 5760779 B2 | 8/2015 |
| KR | 20160057642 A | 5/2016 |
| KR | 20160065230 A | 6/2016 |
| KR | 20170077945 A | 7/2017 |

*Primary Examiner* — C Melissa Koslow
(74) *Attorney, Agent, or Firm* — Cantor Colburn LLP

(57) ABSTRACT

A semiconductor-ligand composite, including a semiconductor nanocrystal and a ligand layer including an organic ligand coordinated on a surface of the semiconductor nanocrystal, wherein the organic ligand includes a compound represented by Chemical Formula 1, a compound represented by Chemical Formula 2 or a combination thereof, wherein Chemical Formula 1 and Chemical Formula 2 are given below and are the same as described in detail herein.

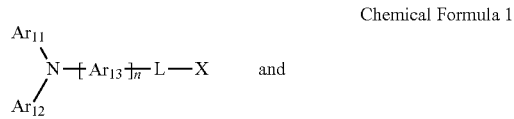

Chemical Formula 1

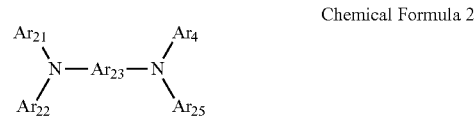

Chemical Formula 2

15 Claims, 2 Drawing Sheets

SEMICONDUCTOR NANOCRYSTAL-LIGAND COMPOSITE AND DEVICE INCLUDING COMPOSITE

CROSS-REFERENCE TO RELATED APPLICATION

This application claims priority to and the benefit of Korean Patent Application No. 10-2018-0072945, filed on Jun. 25, 2018, and all the benefits accruing therefrom under 35 U.S.C. § 119, the content of which is incorporated herein in its entirety by reference.

BACKGROUND

1. Field

A semiconductor nanocrystal-ligand composite and an electronic device including the semiconductor nanocrystal-ligand composite are disclosed.

2. Description of the Related Art

Semiconductor nanocrystals (i.e., quantum dots) may have different energy bandgaps by controlling sizes and compositions of the nanocrystals, and thus may emit light of various photoluminescence wavelengths. The semiconductor nanocrystals have a theoretical quantum yield (QY) of 100% and can emit light having a high color purity (e.g., full width at half maximum (FWHM) of less than or equal to about 40 nanometers). Thus, use of semiconductor nanocrystals as a light emitting material can provide increased luminous efficiency and improved color reproducibility.

Wet chemical methods can be used to prepare semiconductor nanocrystals. Typically, organic materials such as a dispersing agent are coordinated on the surface of semiconductor nanocrystal during crystal growth. As a result, semiconductor nanocrystals having uniformly controlled sizes and having good photoluminescence characteristics and stability may be provided.

However, these organic materials are insulating materials and thus may disturb charge flows such as those of electrons, holes, and the like. Therefore, when semiconductor nanocrystals are applied to an electronic device, the charge flows can be disrupted, which may deteriorate device efficiency or life-span, and require an increase a driving voltage. Accordingly, there exists a continuing need to develop semiconductor nanocrystals to overcome these and other challenges.

SUMMARY

An embodiment provides a semiconductor nanocrystal-ligand composite capable of improving charge mobility to improve device efficiency and life-span and reduce a driving voltage.

Another embodiment provides a method of manufacturing the semiconductor nanocrystal-ligand composite.

Another embodiment provides a device including the semiconductor nanocrystal-ligand composite.

According to an embodiment, a semiconductor nanocrystal-ligand composite includes a semiconductor nanocrystal and a ligand layer including an organic ligand coordinated on a surface of the semiconductor nanocrystal, wherein the organic ligand is a compound represented by Chemical Formula 1, a compound represented by Chemical Formula 2, or a combination thereof.

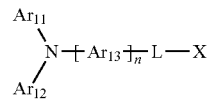

Chemical Formula 1

In Chemical Formula 1, $Ar_{11}$ and $Ar_{12}$ may each independently be a substituted or unsubstituted C6 to C20 aryl group; a substituted or unsubstituted C2 to C20 heteroaryl group; or at least two aromatic ring groups linked by a linker wherein each aromatic ring group is one of the substituted or unsubstituted C6 to C20 aryl group and the substituted or unsubstituted C2 to C20 heteroaryl group, $Ar_{13}$ may be a substituted or unsubstituted C6 to C18 arylene group; a substituted or unsubstituted C2 to C18 heteroarylene group; or at least two aromatic ring groups linked by a linker wherein each aromatic ring group is one of the substituted or unsubstituted C6 to C18 arylene group and the substituted or unsubstituted C2 to C18 heteroarylene group, n may be an integer ranging from 0 to 3, L may be a substituted or unsubstituted C1 to C30 alkylene group; or a substituted or unsubstituted C1 to C30 alkylene group including at least one linker that is —O—, —NR$^a$—, —C(=O)—, —OC(=O)—, —C(=O)O—, —S(=O)$_2$—, —Si(R$^b$R$^c$)$_2$—, —C(=O)NR$^d$—, —C(R$^e$)=C(R$^f$)—, or —C≡C—, wherein, R$^a$, R$^b$, R$^c$, R$^d$, R$^e$, and R$^f$ may each independently be hydrogen, a cyano group, a halogen, a C1 to C10 alkyl group, a C2 to C10 alkenyl group, a C2 to C10 alkynyl group, a C6 to C18 aryl group, or a C2 to C18 heteroaryl group, and X may be a functional group bound to the surface of the semiconductor nanocrystal.

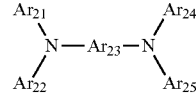

Chemical Formula 2

In Chemical Formula 2, $Ar_{21}$, $Ar_{22}$, $Ar_{24}$, and $Ar_{25}$ may each independently be a substituted or unsubstituted C6 to C20 aryl group; a substituted or unsubstituted C2 to C20 heteroaryl group; or at least two aromatic ring groups linked by a linker wherein each aromatic ring group is one of the substituted or unsubstituted C6 to C20 aryl group and the substituted or unsubstituted C2 to C20 heteroaryl group, $Ar_{23}$ may be a substituted or unsubstituted C6 to C18 arylene group; a substituted or unsubstituted C2 to C18 heteroarylene group; or at least two aromatic ring groups linked by a linker wherein each aromatic ring group is one of the substituted or unsubstituted C6 to C18 arylene group and the substituted or unsubstituted C2 to C18 heteroarylene group, and at least one of $Ar_{21}$, $Ar_{22}$, $Ar_{24}$, and $Ar_{25}$ may have a functional group represented by Chemical Formula 2A.

\*-L-X    Chemical Formula 2A

In Chemical Formula 2A,

L may be a substituted or unsubstituted C1 to C30 alkylene group; or a substituted or unsubstituted C1 to C30 alkylene group including at least one linker that is —O—, —NR$^a$—, —C(=O)—, —OC(=O)—, —C(=O)O—, —S(=O)$_2$—, —Si(R$^b$R$^c$)$_2$—, —C(=O)NR$^d$—, —C(R$^e$)=C(R$^f$)—, or —C≡C—, wherein, R$^a$, R$^b$, R$^c$, R$^d$, R$^e$, and R$^f$ may each independently be hydrogen, a cyano group, a halogen, a C1 to C10 alkyl group, a C2 to C10 alkenyl group, a C2 to C10 alkynyl group, a C6 to C18 aryl group, or a C2 to C18 heteroaryl group, and X may be a functional group bound to the surface of the semiconductor nanocrystal.

Ar$_1$ and Ar$_{12}$ of Chemical Formula 1 and Ar$_{21}$, Ar$_{22}$, Ar$_{24}$, and Ar$_{25}$ of Chemical Formula 2 may each independently be a phenyl group, a naphthyl group, an anthryl group, a phenanthryl group, a pyrenyl group, a perylenyl group, a fluorenyl group, a pentalenyl group, a pyrazolyl group, an imidazolyl group, a thiazolyl group, a triazolyl group, a carbazolyl group, a pyridyl group, a pyridazinyl group, a pyridmidyl group, a pyrazinyl group, a triazinyl group, an indazolyl group, an indolizinyl group, a benzimidazolyl group, a benzthiazolyl group, a benzothiophenyl group, a benzopurinyl group, an isoquinolinyl group, or a purinyl group.

The functional group X may be a functional group bound to the surface of the semiconductor nanocrystal and may be a thiol group (—SH), an amine group, an amide group, an imine group, an imide group, a cyano group (—CN), a carboxyl group (—COOH), a sulfonic acid group (—SO$_3$H), a phosphine group (—PRR', wherein R and R' are each independently hydrogen or a C1 to C10 alkyl group), a phosphide group (—PR$_{3-x}$M$_x$, (wherein R is hydrogen or a C1 to C10 alkyl group and M is a trivalent metal), a phosphonic acid group (—PO(OR)$_2$, wherein each R is independently hydrogen or a C1 to C10 alkyl group), —OP(O)Cl$_2$, —POCl$_2$, —Si(OH)$_3$, —SiCl$_3$, —Si(OR)$_3$ (wherein each OR is independently a C1 to C10 alkoxy group), a hydroxy group (—OH), an ether group (—ROR', wherein R is a C1 to C10 alkylene group and R' is a C1 to C10 alkyl group), —C(O)R (wherein R is a halogen or a C1 to C10 alkyl group), —SO$_2$Cl, and a nitro group (—NO$_2$).

The organic ligand may be a compound represented by Chemical Formula 3.

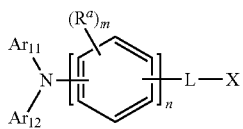

Chemical Formula 3

In Chemical Formula 3,

Ar$_{11}$ and Ar$_{12}$ may each independently be a substituted or unsubstituted C6 to C20 aryl group; a substituted or unsubstituted C2 to C20 heteroaryl group; or at least two aromatic ring groups linked by a linker wherein each aromatic ring group is one of the substituted or unsubstituted C6 to C20 aryl group and the substituted or unsubstituted C2 to C20 heteroaryl group, each R$^a$ may by the same or different, and may each independently be hydrogen, a cyano group, a halogen, a C1 to C10 alkyl group, a C2 to C10 alkenyl group, a C2 to C10 alkynyl group, a C6 to C18 aryl group, or a C2 to C18 heteroaryl group, m is the same as the number of hydrogen of an aromatic ring, or when m is two or more, at least two adjacent groups R$^a$ are linked with each other to form a fused ring, n may be an integer ranging from 0 to 3, L may be a substituted or unsubstituted C1 to C30 alkylene group; or a substituted or unsubstituted C1 to C30 alkylene group including at least one linker that is —O—, —NR$^a$—, —C(=O)—, —OC(=O)—, —C(=O)O—, —S(=O)$_2$—, —Si(R$^b$R$^c$)$_2$—, —C(=O)NR$^d$—, —C(R$^e$)=C(R$^f$)—, or —C≡C—, wherein, R$^a$, R$^b$, R$^c$, R$^d$, R$^e$, and R$^f$ may each independently be hydrogen, a cyano group, a halogen, a C1 to C10 alkyl group, a C2 to C10 alkenyl group, a C2 to C10 alkynyl group, a C6 to C18 aryl group, or a C2 to C18 heteroaryl group, and X may be a functional group bound to the surface of the semiconductor nanocrystal.

The organic ligand may be a compound represented by Chemical Formula 4.

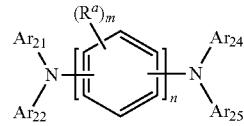

Chemical Formula 4

In Chemical Formula 4,

Ar$_{21}$, Ar$_{22}$, Ar$_{24}$, and Ar$_{25}$ may independently be a substituted or unsubstituted C6 to C20 aryl group; a substituted or unsubstituted C2 to C20 heteroaryl group; or at least two aromatic ring groups linked by a linker wherein each aromatic ring group is one of the substituted or unsubstituted C6 to C20 aryl group and the substituted or unsubstituted C2 to C20 heteroaryl group, each R$^a$ may be the same or differently, and may each independently be hydrogen, a cyano group, a halogen, a C1 to C10 alkyl group, a C2 to C10 alkenyl group, a C2 to C10 alkynyl group, a C6 to C18 aryl group, or a C2 to C18 heteroaryl group, m is the same as the number of hydrogen of an aromatic ring, or when m is two or more, at least two adjacent groups R$^a$ are linked with each other to form a fused ring, n may be an integer ranging from 0 to 3, and at least one of Ar$_{21}$, Ar$_{22}$, Ar$_{24}$, and Ar$_{25}$ has the functional group represented by Chemical Formula 2A.

The organic ligand may be a compound represented by Chemical Formula 5.

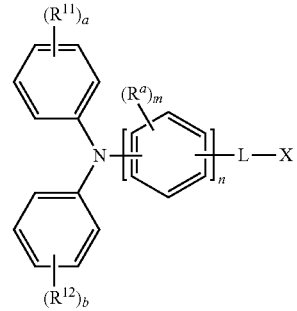

Chemical Formula 5

In Chemical Formula 5,

R$^{11}$ and R$^{12}$ may each independently be hydrogen, a cyano group, a halogen, C1 to C10 alkyl group, a C2 to C10 alkenyl group, a C2 to C10 alkynyl group, a C6 to C18 aryl group, or a C2 to C18 heteroaryl group, a and b may each independently be an integer ranging from 0 to 5, when each of a and b are 2 or more, adjacent two functional groups of a plurality of groups R$^{11}$ and groups R$^{12}$ are linked with each other to form a fused ring, each $R^a$ may be the same or different, and may each independently be hydrogen, a cyano group, a halogen, a C1 to C10 alkyl group, a C2 to C10 alkenyl group, a C2 to C10 alkynyl group, a C6 to C18 aryl group, or a C2 to C18 heteroaryl group, m is the same as the number of hydrogen of an aromatic ring, or when m is two or more, at least two adjacent groups $R^a$ are linked with each other to form a fused ring, n may be an integer ranging from 0 to 3, L may be a substituted or unsubstituted C1 to C30 alkylene group; or a substituted or unsubstituted C1 to C30 alkylene group including at least one linker that is —O—, —$NR^a$—, —C(=O)—, —OC(=O)—, —C(=O)O—, —S(=O)$_2$—, —Si($R^b R^c$)$_2$—, —C(=O)$NR^d$—, —C($R^e$)=C($R^f$)—, or —C≡C—, wherein, $R^a$, $R^b$, $R^c$, $R^d$, $R^e$, and $R^f$ may each independently be hydrogen, a cyano group, a halogen, a C1 to C10 alkyl group, a C2 to C10 alkenyl group, a C2 to C10 alkynyl group, a C6 to C18 aryl group, or a C2 to C18 heteroaryl group, and X may be a functional group bound to the surface of the semiconductor nanocrystal.

The organic ligand may be a compound represented by Chemical Formula 6.

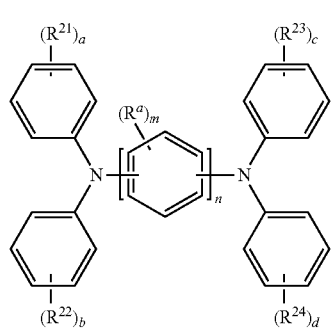

Chemical Formula 6

In Chemical Formula 6, $R^{21}$ to $R^{24}$ may each independently be hydrogen, a cyano group, a halogen, a C1 to C10 alkyl group, a C2 to C10 alkenyl group, a C2 to C10 alkynyl group, a C6 to C18 aryl group, or a C2 to C18 heteroaryl group, a, b, c, and d may each independently be an integer ranging from 0 to 5, when each of a, b, c, and d are 2 or more, adjacent two functional groups of a plurality of $R^{21}$ to $R^{24}$ are linked with each other to form a fused ring, each $R^a$ may be the same or different, and may each independently be hydrogen, a cyano group, a halogen, a C1 to C10 alkyl group, a C2 to C10 alkenyl group, a C2 to C10 alkynyl group, a C6 to C18 aryl group, or a C2 to C18 heteroaryl group, m is the same as the number of hydrogen of an aromatic ring, or when m is two or more, at least two adjacent groups $R^a$ are linked with each other to form a fused ring, n may be an integer ranging from 0 to 3, L may be a substituted or unsubstituted C1 to C30 alkylene group; or a substituted or unsubstituted C1 to C30 alkylene group including at least one linker that is —O—, —$NR^a$—, —C(=O)—, —OC(=O)—, —C(=O)O—, —S(=O)$_2$—, —Si($R^b R^c$)$_2$—, —C(=O)$NR^d$—, —C($R^e$)=C($R^f$)—, or —C≡C—, wherein, $R^a$, $R^b$, $R^c$, $R^d$, $R^e$, and $R^f$ may each independently be hydrogen, a cyano group, a halogen, a C1 to C10 alkyl group, a C2 to C10 alkenyl group, a C2 to C10 alkynyl group, a C6 to C18 aryl group, or a C2 to C18 heteroaryl group, and X may be a functional group bound to the surface of the semiconductor nanocrystal.

The ligand layer may further include at least one second organic ligand that is RCOOH, RNH$_2$, R$_2$NH, R$_3$N, RSH, RH$_2$PO, R$_2$HPO, R$_3$PO, RH$_2$P, R$_2$HP, R$_3$P, ROH, RCOOR', RPO(OH)$_2$, or R$_2$POOH, wherein, R and R' may each independently be a substituted or unsubstituted C1 to C24 alkyl group, a substituted or unsubstituted C2 to C24 alkenyl group, or a substituted or unsubstituted C2 to C24 alkynyl group.

The semiconductor nanocrystal may be a Group II-VI compound, a Group III-V compound, a Group IV-VI compound, a Group IV element or compound, a Group I-III-VI compound, a Group I-II-IV-VI compound, or a combination thereof.

The semiconductor nanocrystal-ligand composite may further include a polyvalent metal compound.

The polyvalent metal compound may include Zn, In, Ga, Mg, Ca, Sc, Sn, Ti, V, Cr, Mn, Fe, Co, Ni, Cu, Sr, Y, Zr, Nb, Mo, Cd, Ba, Au, Ag, Pb, Hg, TI, or a combination thereof.

The polyvalent metal compound may be an organometallic compound, an organic salt, an inorganic salt, or a combination thereof.

The polyvalent metal compound may be a metal halide, a metal C1 to C30 alkyl, a metal C1 to C30 carboxylate, a metal C3 to C30 (meth)acrylate, a metal dialkyldithiocarbamate, a metal chalcogenide, or a combination thereof.

Another aspect of an embodiment provides an electronic device including a first electrode and a second electrode facing each other; and an emission layer disposed between the first electrode and the second electrode and including a plurality of semiconductor nanocrystals, wherein the plurality of semiconductor nanocrystals include the aforementioned semiconductor nanocrystal-ligand composite.

The electronic device may be a light emitting diode (LED), an organic light emitting diode (OLED), a sensor, a photodetector, an imaging sensor, a solar cell, or a liquid crystal display (LCD) device.

The semiconductor nanocrystal-ligand composite may improve charge mobility to improve device efficiency and life-span, and reduce a driving voltage. The semiconductor nanocrystal-ligand composite may be applied to various display devices and biological labeling (biosensor, bio imaging), a photo detector, a solar cell, a polymer composite, and an inorganic hybrid composite.

BRIEF DESCRIPTION OF THE DRAWINGS

These and/or other aspects will become apparent and more readily appreciated from the following description of the exemplary embodiments, taken in conjunction with the accompanying drawings.

DETAILED DESCRIPTION

Figure 1:
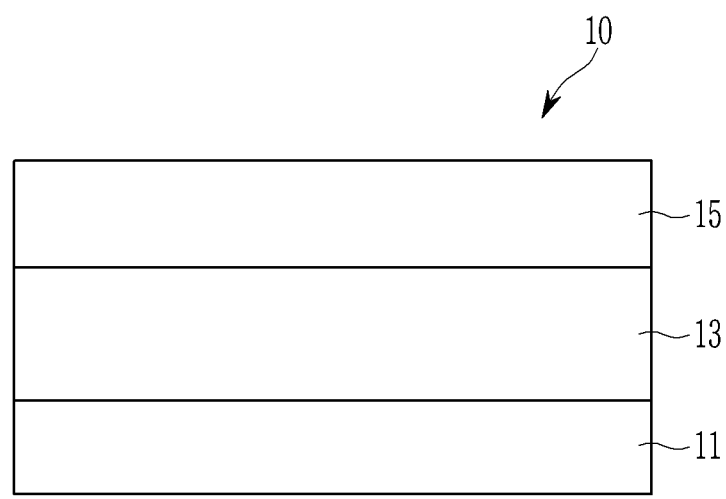
FIG. 1 is a schematic cross-sectional view showing a light emitting device according to an embodiment.

Advantages and characteristics of this disclosure, and a method for achieving the same, will become evident referring to the following example embodiments together with the drawings attached hereto, wherein like reference numerals refer to like elements throughout. In this regard, the present embodiments should not be construed as being limited to the descriptions set forth herein. Accordingly, the embodiments are described in further detail below, and by referring to the figures, to explain exemplary aspects.

The terminology used herein is for the purpose of describing particular examples only and is not intended to limit the present inventive concept. As used herein, the term "and/or" includes any and all combinations of one or more of the associated listed items. The term "or" means "and/or." The expression "/" may be interpreted as "and" or "or" according to the context. Expressions such as "at least one of," when preceding a list of elements, modify the entire list of elements and do not modify the individual elements of the list. The singular forms "a," "an," and "the" include the plural unless the context clearly indicates otherwise. In addition, unless explicitly described to the contrary, the terms such as "comprise," "have," and include," and variations such as "comprises" and "comprising," "haves" and "having," and "includes" and "including," will be understood to indicate the existence of the stated elements, features, numbers, steps, actions, components, parts, or combinations thereof disclosed in the specification, but do not exclude the possibility that one or more other elements, features, numbers, steps, actions, components, parts, or combinations thereof may exist or may be added.

If not stated otherwise, all terms (including technical and scientific terms) in the specification have the same meaning as commonly understood by one skilled in the art to which the general inventive concept belongs. The terms, such as those defined in commonly used dictionaries, should be interpreted as having a meaning that is consistent with their meaning in the context of the relevant art and the present disclosure, may not be interpreted in an idealized or overly formal sense unless clearly so defined herein.

In the drawings, the thickness of layers, films, panels, regions, etc., are exaggerated for clarity. Like reference numerals designate like elements throughout the specification.

It will be understood that when an element such as a layer, film, region, or substrate is referred to as being "on" another element, it can be directly on the other element or intervening elements may also be present. In contrast, when an element is referred to as being "directly on" another element, there are no intervening elements present.

It will be understood that, although the terms first, second, third etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of the present embodiments.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

In the drawings, the thickness is enlarged or reduced in order to clearly represent layers and regions. Like elements are denoted by like reference numerals throughout the specification. It will be understood that when a layer, a film, a region, or a panel is referred to as being "formed on" another layer, film, region, or panel, it can be directly or indirectly formed on the other layer, film, region, or panel. Throughout the specification, the terms of the first, the second, etc. may be used to describe various components, but the components should not be limited by these terms. These components are only used to distinguish one component from another. Components having substantially the same functional configuration in the present specification and drawings are denoted by the same reference numerals, and redundant description thereabout will be omitted.

Exemplary embodiments are described hereinafter with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Compounds are described using standard nomenclature. For example, any position not substituted by any indicated group is understood to have its valency filled by a bond as indicated, or a hydrogen atom. A dash ("-") that is not between two letters or symbols is used to indicate a point of attachment for a substituent. For example, —CHO is attached through carbon of the carbonyl group.

A named "R" or group will generally have the structure that is recognized in the art as corresponding to a group having that name, unless specified otherwise herein. For the purposes of illustration, certain representative "R" groups as set forth above are defined below.

Description of compounds of the present disclosure is limited by principles of chemical bonding known to those of ordinary skill in the art. Accordingly, where a group may be substituted by one or more of a number of substituents, such substitutions are selected so as to comply with principles of chemical bonding and to give compounds which are not inherently unstable and/or would be known to one of ordinary skill in the art as likely to be unstable under ambient conditions.

The term "hydrocarbon" as used herein refers to any chemical group comprising hydrogen and carbon. The hydrocarbon may be substituted or unsubstituted.

The term "alkyl group" used herein refers to a monovalent fully saturated branched or unbranched (or linear) hydrocarbon group. The term "alkylene group" refers to a divalent alkyl group.

As used herein, the term "cycloalkyl group" refers to a non-aromatic carbocyclic ring group containing only carbon atoms as ring members, and includes saturated and partially unsaturated non-aromatic monocyclic, bicyclic, and tricyclic hydrocarbon groups.

The term "alkenyl group" as used herein refers to a monovalent branched or unbranched hydrocarbon groups having at least one carbon-carbon double bond. The term "alkenylene group" refers to a divalent alkenyl group.

The term "alkynyl group" as used herein refers to a monovalent branched or unbranched hydrocarbon groups having at least one carbon-carbon triple bond. The term "alkynylene group" refers to a divalent alkynyl group.

As used herein, an "aryl group" refers to a monovalent cyclic aromatic group containing only carbon in the ring structure. Aryl groups can contain 1 to 3 separate, fused, or pendant aromatic rings and from 6 to about 24 ring atoms (e.g. a C6 to C18 or C6 to C12 aryl groups), without heteroatoms as ring members. Aryl groups further include groups in which an aromatic ring is fused to at least one carbocyclic group. The term "arylene group" refers to a divalent or polyvalent aryl group. When the aryl group is described as being linked by a linker to another group, it is understood that the aryl group is not monovalent.

The term "alkylarylene group" refers to an arylene group substituted with an alkyl group.

The term "heteroaryl group" refers to a monovalent, monocyclic or polycyclic aromatic group having at least one ring carbon atom replaced by at least one heteroatom selected from N, O, P, and S, and with the remaining aromatic ring atoms being carbon. The heteroaryl group may contain, for example, 1 to 5 heteroatoms, and 5 to 25 aromatic ring atoms in total (e.g., a C2 to C12 or C2 to C4 heteroaryl group). The heteroatoms S or N may be oxidized to have various oxidation states. As used herein, the term aromatic ring encompasses both aryl and heteroaryl groups. The term "heteroarylene group" refers to a divalent or polyvalent heteroaryl group. When the heteroaryl group is described as being linked by a linker to another group, it is understood that the heteroaryl group is not monovalent.

As used herein, "hetero" refers to a group including one or more (e.g., 1 to 3) heteroatoms of N, O, S, Si, P, or a combination thereof. Examples include heteroalkyl, heterocycloalkyl, heteroalkylene, heteroaryl, or the like.

As used herein, the term "heteroalkylarylene group" refers to an arylene group substituted with a heteroalkyl group.

The term "halogen atom" or "halogen" as used herein includes fluorine, bromine, chlorine, iodine, and the like.

The term "cyano group" as used herein refers to a group of the formula —CN.

As used herein, with regard to the term "substituted or unsubstituted" group, when a definition is not otherwise provided, "substituted" means a compound or a moiety wherein at least one hydrogen atom thereof is replaced by one or more substituent groups selected from a C1 to C30 alkyl group, a C2 to C30 alkynyl group, a C6 to C30 aryl group, a C7 to C30 alkylarylene group, a C1 to C30 alkoxy group, a C1 to C30 heteroalkyl group, a C3 to C30 heteroalkylarylene group, a C3 to C30 cycloalkyl group, a C3 to C15 cycloalkenyl group, a C6 to C30 cycloalkynyl group, a C2 to C30 heterocycloalkyl group, a halogen (—F, —Cl, —Br, or —I), a hydroxy group (—OH), a nitro group (—NO$_2$), a cyano group (—CN), an amino group (—NRR', wherein R and R' may each independently be hydrogen or a C1 to C6 alkyl group), an azido group (—N$_3$), an amidino group (—C(=NH)NH$_2$)), a hydrazino group (—NHNH$_2$), a hydrazono group (=N(NH$_2$)), an aldehyde group (—C(=O)H), a carbamoyl group (—C(O)NH$_2$), a thiol group (—SH), an ester group (—C(=O)OR, wherein R is a C1 to C6 alkyl group or a C6 to C12 aryl group), a carboxyl group (—COOH) or a salt thereof (—C(=O)OM, wherein M is an organic or inorganic cation), a sulfonic acid group (—SO$_3$H) or a salt thereof (—SO$_3$M, wherein M is an organic or inorganic cation), a phosphoric acid group (—PO$_3$H$_2$) or a salt thereof (—PO$_3$MH or —PO$_3$M$_2$, wherein M is an organic or inorganic cation), or a combination thereof.

For example, "substituted" may refer to a compound or a moiety wherein at least one of hydrogen atoms thereof is replaced by a C1 to C6 alkyl group or a C6 to C12 aryl group.

As used herein, "Group" refers to a group of Periodic Table.

As used herein, "Group II" refers to Group IIA and Group IIB, and examples of Group II metal may be Cd, Zn, Hg, and Mg, but are not limited thereto.

As used herein, "Group III" refers to Group IIIA and Group IIIB, and examples of Group III metal may be Al, In, Ga, and TI, but are not limited thereto.

As used herein, "Group IV" refers to Group IVA and Group IVB, and examples of a Group IV metal may be Si, Ge, and Sn, but are not limited thereto.

As used herein, a "metal" includes metals and semimetals such as Si.

As used herein, "Group I" refers to Group IA and Group IB, and examples may include Li, Na, K, Rb, and Cs, but are not limited thereto.

As used herein, "Group V" refers to Group VA, and examples may include nitrogen, phosphorus, arsenic, antimony, and bismuth, but are not limited thereto.

As used herein, "Group VI" refers to Group VIA, and examples may include sulfur, selenium, and tellurium, but are not limited thereto.

The expression * as used herein indicates a binding site to a neighboring atom, unless otherwise stated.

A semiconductor nanocrystal (also referred to as a quantum dot) may absorb light from an excitation source and emit light corresponding to its energy bandgap. For example, semiconductor nanocrystals may have narrower energy bandgaps as the particle size increases and light emitting wavelengths may increase. Since semiconductor nanocrystals have merits such as high luminous efficiency (quantum yield), high color purity, high stability, wavelength control capability (spectral tenability), and the like, they have attracted attention as a light emitting material in various fields such as display devices, energy devices, and bioluminescence devices.

An organic ligand can be coordinated on the surface of semiconductor nanocrystals to ensure dispersibility of semiconductor nanocrystals. Because these conventional organic ligands are insulating materials, they may inhibit flows of electrons and holes. Therefore, the flows of electrons or holes may be improved by coordinating an organic ligand including a moiety including an aryl or amine moiety capable of moving electrons or holes well on the surface of the semiconductor nanocrystal.

According to an embodiment, a semiconductor nanocrystal-ligand composite includes a semiconductor nanocrystal and a ligand layer including an organic ligand coordinated on a surface of the semiconductor nanocrystal, wherein the organic ligand includes a compound of a compound represented by Chemical Formula 1, a compound represented by Chemical Formula 2, or a combination thereof.

Chemical Formula 1

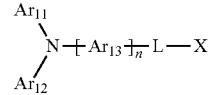

In Chemical Formula 1,

Ar$_{11}$ and Ar$_{12}$ may each independently be a substituted or unsubstituted C6 to C20 aryl group; a substituted or unsubstituted C2 to C20 heteroaryl group; or at least two aromatic ring groups linked by a linker wherein each aromatic ring group is one of the substituted or unsubstituted C6 to C20 aryl group and the substituted or unsubstituted C2 to C20 heteroaryl group, each $Ar_{13}$ may be the same or different, and may each independently be a substituted or unsubstituted C6 to C18 arylene group; a substituted or unsubstituted C2 to C18 heteroarylene group; or at least two aromatic ring groups linked by a linker wherein each aromatic ring group is one of the substituted or unsubstituted C6 to C18 arylene group and the substituted or unsubstituted C2 to C18 heteroarylene group, n may be an integer ranging from 0 to 3, L may be a substituted or unsubstituted C1 to C30 alkylene group; or a substituted or unsubstituted C1 to C30 alkylene group including at least one linker that is —O—, —NR$^a$—, —C(=O)—, —OC(=O)—, —C(=O)O—, —S(=O)$_2$—, —Si(R$^b$R$^c$)$_2$—, —C(=O)NR$^d$—, —C(R$^e$)=C(R$^f$)—, or —C≡C— (wherein, R$^a$, R$^b$, R$^c$, R$^d$, R$^e$, and R$^f$ may each independently be hydrogen, a cyano group, a halogen, a C1 to C10 alkyl group, a C2 to C10 alkenyl group, a C2 to C10 alkynyl group, a C6 to C18 aryl group, or a C2 to C18 heteroaryl group), and X may be a functional group bound to the surface of the semiconductor nanocrystal.

In an embodiment, the linker in the ring group of $Ar_{13}$ may be a single bond.

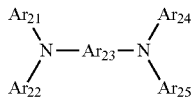

Chemical Formula 2

In Chemical Formula 2, $Ar_{21}$, $Ar_{22}$, $Ar_{24}$, and $Ar_{25}$ may each independently be a substituted or unsubstituted C6 to C20 aryl group; a substituted or unsubstituted C2 to C20 heteroaryl group; or at least two aromatic ring groups linked by a linker wherein each aromatic ring group is one of the substituted or unsubstituted C6 to C18 arylene group and the substituted or unsubstituted C2 to C18 heteroarylene group, $Ar_{23}$ may be a substituted or unsubstituted C6 to C18 arylene group; a substituted or unsubstituted C2 to C18 heteroarylene group; or at least two aromatic ring groups linked by a linker wherein each aromatic ring group is one of the substituted or unsubstituted C6 to C18 arylene group and the substituted or unsubstituted C2 to C18 heteroarylene group, and at least one of $Ar_{21}$, $Ar_{22}$, $Ar_{24}$, and $Ar_{25}$ has a functional group represented by Chemical Formula 2A.

*-L-X      Chemical Formula 2A

In Chemical Formula 2A,

L may be a substituted or unsubstituted C1 to C30 alkylene group; or a substituted or unsubstituted C1 to C30 alkylene group including at least one linker that is —O—, —NR$^a$—, —C(=O)—, —OC(=O)—, —C(=O)O—, —S(=O)$_2$—, —Si(R$^b$R$^c$)$_2$—, —C(=O)NR$^d$—, —C(R$^e$)=C(R$^f$)—, or —C≡C— (wherein, R$^a$, R$^b$, R$^c$, R$^d$, R$^e$, and R$^f$ may each independently be hydrogen, a cyano group, a halogen, a C1 to C10 alkyl group, a C2 to C10 alkenyl group, a C2 to C10 alkynyl group, a C6 to C18 aryl group, or a C2 to C18 heteroaryl group), and X may be a functional group bound to the surface of the semiconductor nanocrystal.

As used herein, the term "at least two aromatic ring groups linked by a linker wherein each aromatic ring group is one of the substituted or unsubstituted C6 to C18 (or C20) arylene group and the substituted or unsubstituted C2 to C18 (or C20) heteroarylene group" means an aromatic ring system that includes at least two aromatic ring groups connected by a linker, where each aromatic ring group can be a aryl group, a heteroaryl group, or a combination thereof. In an embodiment, the linker may be a single bond. In another embodiment, the linker may be a single bond, single bond, —(CR$^a$R$^b$)$_{n1}$—, —O—, —S—, —Se—, —C(=O)—, —C(=O)O—, —OC(=O)—, —N=, —NR$^c$—, —SiR$^d$R$^e$—, or —GeR$^f$R$^g$—, wherein R$^a$ to R$^g$ may each independently be hydrogen, a substituted or unsubstituted C1 to C30 alkyl group, a substituted or unsubstituted C6 to C30 aryl group, a substituted or unsubstituted C3 to C30 heteroaryl group, a substituted or unsubstituted C1 to C6 alkoxy group, a halogen, or a cyano group, and n1 may be an integer ranging from 1 to 30.

$Ar_{11}$ and $Ar_{12}$ of Chemical Formula 1 and $Ar_{21}$, $Ar_{22}$, $Ar_{24}$, and $Ar_{25}$ of Chemical Formula 2 may each independently be a phenyl group, a naphthyl group, an anthryl group, a phenanthryl group, a pyrenyl group, a perylenyl group, a fluorenyl group, a pentalenyl group, a pyrazolyl group, an imidazolyl group, a thiazolyl group, a triazolyl group, a carbazolyl group, a pyridyl group, a pyridazinyl group, a pyridmidyl group, a pyrazinyl group, a triazinyl group, an indazolyl group, an indolizinyl group, a benzimidazolyl group, a benzthiazolyl group, a benzothiophenyl group, a benzopurinyl group, an isoquinolinyl group, or a purinyl group.

In $Ar_{11}$ and $Ar_{12}$ of Chemical Formula 1 and $Ar_{21}$, $Ar_{22}$, $Ar_{24}$, and $Ar_{25}$ of Chemical Formula 2, the linker linking the at least two aromatic ring groups may each independently be a single bond, —(CR$^a$R$^b$)$_{n1}$—, —O—, —S—, —Se—, —C(=O)—, —C(=O)O—, —OC(=O)—, —N=, —NR$^c$—, —SiR$^d$R$^e$—, or —GeR$^f$R$^g$—, wherein R$^a$ to R$^g$ may each independently be hydrogen, a substituted or unsubstituted C1 to C30 alkyl group, a substituted or unsubstituted C6 to C30 aryl group, a substituted or unsubstituted C3 to C30 heteroaryl group, a substituted or unsubstituted C1 to C6 alkoxy group, a halogen, or a cyano group, and n1 may be an integer ranging from 1 to 30.

$Ar_{13}$ of Chemical Formula 1 and $Ar_{23}$ of Chemical Formula 2 may be each independently a substituted or unsubstituted monocyclic arylene group; a substituted or unsubstituted condensation polycyclic arylene group; an arylene group where at least two monocyclic arylene groups or at least two condensation polycyclic arylene groups are linked by a linker; a substituted or unsubstituted monocyclic heteroarylene group; a substituted or unsubstituted condensation polycyclic heteroarylene group; or a heteroarylene group where at least two monocyclic heteroarylene groups or at least two condensation polycyclic heteroarylene groups are linked by a linker.

In an embodiment, $Ar_{13}$ of Chemical Formula 1 and $Ar_{23}$ of Chemical Formula 2 may each independently be a phenylene group, a naphthylene group, an anthrylene group, a phenanthrylene group, a pyrenylene group, a perylenylene group, a fluorenylene group, a pentalenylene group, a pyrazolylene group, an imidazolylene group, a thiazolylene group, a triazolylene group, a carbazolylene group, a pyridylene group, a pyridazinylene group, a pyridmidylene group, a pyrazinylene group, a triazinylene group, an indazolylene group, indolizinylene group, a benzimidazoylene group, a benzthiazolylene group, a benzothiophenylene group, a benzopurinylene group, an isoquinolinylene group, a purinylene group, a biphenylene group, or a triphenylene group.

L of Chemical Formula 1 and Chemical Formula 2A may be an alkylene group represented by $(CRR')_n$. Herein, R and R' may each independently be hydrogen or a C1 to C6 alkyl group, and n may be greater than or equal to 1, greater than or equal to 2, greater than or equal to 3, greater than or equal to 4, greater than or equal to 5 and less than or equal to 20, less than or equal to 18, less than or equal to 16, less than or equal to 14, or less than or equal to 12. Non-adjacent substituted or unsubstituted methylene group of the $(CRR')_n$ main chain may include at least one linker that is —O—, —$NR^a$—, —C(=O)—, —OC(=O)—, —C(=O)O—, —S(=O)$_2$—, —Si($R^b R^c$)$_2$—, and —C(=O)$NR^d$— (wherein, $R^a$, $R^b$, $R^c$, and $R^d$ may each independently be hydrogen, a cyano group, a halogen, a C1 to C10 alkyl group, a C2 to C10 alkenyl group, a C2 to C10 alkynyl group, a C6 to C18 aryl group, and a C2 to C18 heteroaryl group).

For example, L may be represented by Chemical Formula L'.

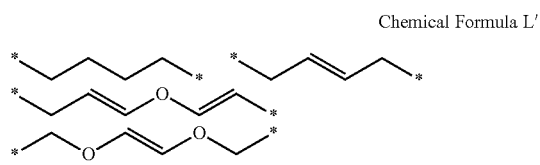

Chemical Formula L'

The functional group X may be a functional group bound to the surface of the semiconductor nanocrystal and may be a thiol group (—SH), an amine group, an amide group, an imine group, an imide group, a cyano group (—CN), a carboxyl group (—COOH), a sulfonic acid group (—SO$_3$H), a phosphine group (—PRR', wherein R and R' are each independently hydrogen or a C1 to C10 alkyl group), a phosphide group (—PR$_{3-x}$M$_x$, (wherein R is hydrogen or a C1 to C10 alkyl group and M is a trivalent metal), a phosphonic acid group (—PO(OR)$_2$, wherein each R is independently hydrogen or a C1 to C10 alkyl group), —OP(O)Cl$_2$, —POCl$_2$, —Si(OH)$_3$, —SiCl$_3$, —Si(OR)$_3$ (wherein OR is a C1 to C10 alkoxy group), a hydroxy group (—OH), an ether group (—ROR', wherein R is a C1 to C10 alkylene group and R' is a C1 to C10 alkyl group), —C(O)R (wherein R is a halogen or a C1 to C10 alkyl group), —SO$_2$Cl, or a nitro group (—NO$_2$). The halogen may be F, Cl, Br, or I.

The organic ligand having the structure of Chemical Formula 1 or Chemical Formula 2 may improve current injection characteristics and life-span of semiconductor nanocrystals, may improve mobility of electrons and holes, and may reduce a driving voltage of the device by lowering a resistance, and thus efficiency and life-span may be greatly improved.

The organic ligand may be a compound represented by Chemical Formula 3.

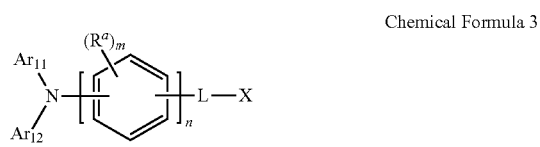

Chemical Formula 3

In Chemical Formula 3, $Ar_{11}$ and $Ar_{12}$ may each independently be a substituted or unsubstituted C6 to C20 aryl group; a substituted or unsubstituted C2 to C20 heteroaryl group; or at least two aromatic ring groups linked by a linker wherein each aromatic ring group is one of the substituted or unsubstituted C6 to C20 aryl group and the substituted or unsubstituted C2 to C20 heteroaryl group, each $R^a$ may be the same or different, and may be hydrogen, a cyano group, a halogen, a C1 to C10 alkyl group, a C2 to C10 alkenyl group, a C2 to C10 alkynyl group, a C6 to C18 aryl group, or a C2 to C18 heteroaryl group, m is the same as the number of hydrogen of an aromatic ring, or when m is two or more, at least two adjacent groups $R^a$ are linked with each other to form a fused ring, n may be an integer ranging from 0 to 3, for example an integer ranging from 1 to 3, L may be a substituted or unsubstituted C1 to C30 alkylene group; or a substituted or unsubstituted C1 to C30 alkylene group including at least one linker that is —O—, —$NR^a$—, —C(=O)—, —OC(=O)—, —C(=O)O—, —S(=O)$_2$—, —Si($R^b R^c$)$_2$—, —C(=O)$NR^d$—, —C($R^e$)=C($R^f$)—, or —C≡C— (wherein, $R^a$, $R^b$, $R^c$, $R^d$, $R^e$, and $R^f$ may each independently be hydrogen, a cyano group, a halogen, a C1 to C10 alkyl group, a C2 to C10 alkenyl group, a C2 to C10 alkynyl group, a C6 to C18 aryl group, or a C2 to C18 heteroaryl group), and X may be a functional group bound to the surface of the semiconductor nanocrystal.

The organic ligand may be a compound represented by Chemical Formula 4.

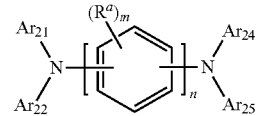

Chemical Formula 4

In Chemical Formula 4, $Ar_{21}$, $Ar_{22}$, $Ar_{24}$, and $Ar_{25}$ may each independently be a substituted or unsubstituted C6 to C20 aryl group; a substituted or unsubstituted C2 to C20 heteroaryl group; or at least two aromatic ring groups linked by a linker wherein each aromatic ring group is one of the substituted or unsubstituted C6 to C20 aryl group and the substituted or unsubstituted C2 to C20 heteroaryl group, each $R^a$ may be the same or different, and may each independently be hydrogen, a cyano group, a halogen, a C1 to C10 alkyl group, a C2 to C10 alkenyl group, a C2 to C10 alkynyl group, a C6 to C18 aryl group, or a C2 to C18 heteroaryl group, m is the same as the number of hydrogen of an aromatic ring, or when m is two or more, at least two adjacent groups $R^a$ are linked with each other to form a fused ring, n may be an integer ranging from 0 to 3, for example an integer ranging from 1 to 3, and at least one of $Ar_{21}$, $Ar_{22}$, $Ar_{24}$, and $Ar_{25}$ may be the functional group represented by Chemical Formula 2A.

The organic ligand may be a compound represented by Chemical Formula 5.

Chemical Formula 5

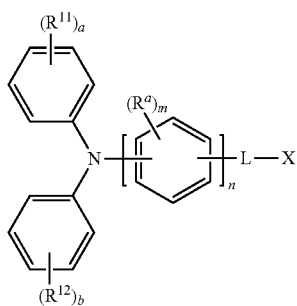

In Chemical Formula 5, $R^{11}$ and $R^{12}$ may each independently be hydrogen, a cyano group, a halogen, a C1 to C10 alkyl group, a C2 to C10 alkenyl group, a C2 to C10 alkynyl group, a C6 to C18 aryl group, or a C2 to C18 heteroaryl group, a and b may each independently be an integer ranging from 0 to 5, when each of a and b are 2 or more, at least two adjacent functional groups of a plurality of $R^{11}$ and $R^{12}$ are linked with each other to form a fused ring, each $R^a$ may be the same or different, and may each independently be hydrogen, a cyano group, a halogen, a C1 to C10 alkyl group, a C2 to C10 alkenyl group, a C2 to C10 alkynyl group, a C6 to C18 aryl group, or a C2 to C18 heteroaryl group, m is the same as the number of hydrogen of an aromatic ring, or when m is two or more, at least two adjacent groups $R^a$ are linked with each other to form a fused ring, n may be an integer ranging from 0 to 3, for example an integer ranging from 1 to 3, L may be a substituted or unsubstituted C1 to C30 alkylene group; or a substituted or unsubstituted C1 to C30 alkylene group including at least one linker that is —O—, —$NR^a$—, —C(=O)—, —OC(=O)—, —C(=O)O—, —S(=O)$_2$—, —Si($R^b R^c$)$_2$—, —C(=O)$NR^d$—, —C($R^e$)=C($R^f$)—, or —C≡C— (wherein, $R^a$, $R^b$, $R^c$, $R^d$, $R^e$, and $R^f$ may each independently be hydrogen, a cyano group, a halogen, a C1 to C10 alkyl group, a C2 to C10 alkenyl group, a C2 to C10 alkynyl group, a C6 to C18 aryl group, or a C2 to C18 heteroaryl group), and X may be a functional group bound to the surface of the semiconductor nanocrystal.

The organic ligand may be a compound represented by Chemical Formula 6.

Chemical Formua 6

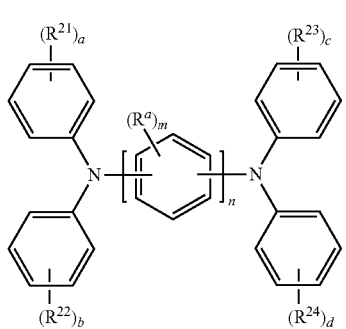

In Chemical Formula 6, $R^{21}$ to $R^{24}$ may each independently be hydrogen, a cyano group, a halogen, a C1 to C10 alkyl group, a C2 to C10 alkenyl group, a C2 to C10 alkynyl group, a C6 to C18 aryl group, or a C2 to C18 heteroaryl group, a, b, c, and d may each independently be an integer ranging from 0 to 5, when each of a, b, c, and d are 2 or more, at least two adjacent functional groups of a plurality of groups $R^{21}$ to $R^{24}$ are linked with each other to form a fused ring, each $R^a$ may be the same or different, and may each independently be hydrogen, a cyano group, a halogen, a C1 to C10 alkyl group, a C2 to C10 alkenyl group, a C2 to C10 alkynyl group, a C6 to C18 aryl group, or a C2 to C18 heteroaryl group, m is the same as the number of hydrogen of an aromatic ring, or when m is two or more, at least two adjacent groups $R^a$ are linked with each other to form a fused ring, n may be an integer ranging from 0 to 3, for example an integer ranging from 1 to 3, L may be a substituted or unsubstituted C1 to C30 alkylene group; or a substituted or unsubstituted C1 to C30 alkylene group including at least one linker that is —O—, —$NR^a$—, —C(=O)—, —OC(=O)—, —C(=O)O—, —S(=O)$_2$—, —Si($R^b R^c$)$_2$—, —C(=O)$NR^d$—, —C($R^e$)=C($R^f$)—, or —C≡C— (wherein, $R^a$, $R^b$, $R^c$, $R^d$, $R^e$, and $R^f$ may each independently be hydrogen, a cyano group, a halogen, a C1 to C10 alkyl group, a C2 to C10 alkenyl group, a C2 to C10 alkynyl group, a C6 to C18 aryl group, or a C2 to C18 heteroaryl group), and X may be a functional group bound to the surface of the semiconductor nanocrystal. In Chemical Formulae 3 and 5, when n is 1, the arylamine group and the *-L-X group bound to the center phenylene may be bound meta or para to each other. When n is greater than or equal to 2, a core structure linked with the arylamine group and the *-L-X group may be represented by Chemical Formula 7.

In Chemical Formulae 4 and 6, when n is 1, two arylamine groups bound to the central phenylene may be bound meta or para to each other. When n is greater than or equal to 2, a core structure linked with the two arylamine groups may be represented by Chemical Formula 7, but is not limited thereto.

Chemical Formula 7

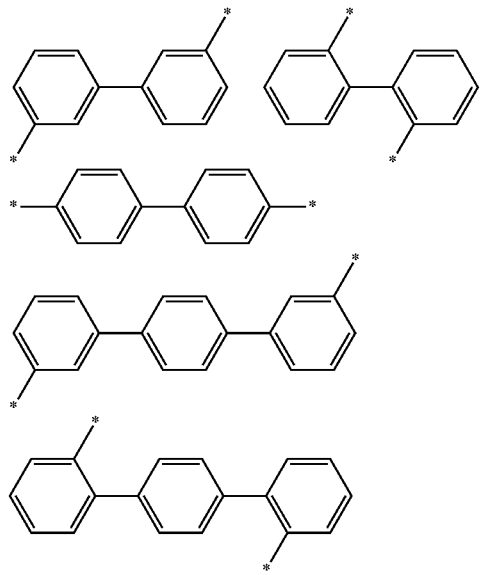

-continued

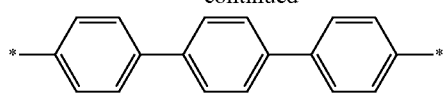

In Chemical Formula 7, one or more hydrogen atoms of each aromatic ring may each independently be replaced by a substituent that is a cyano group, a halogen, a C1 to C10 alkyl group, a C2 to C10 alkenyl group, a C2 to C10 alkynyl group, a C6 to C18 aryl group, or a C2 to C18 heteroaryl group.

In an embodiment, the organic ligand represented by Chemical Formula 1 may be a compound represented by Chemical Formula 8-1.

Chemical Formula 8-1

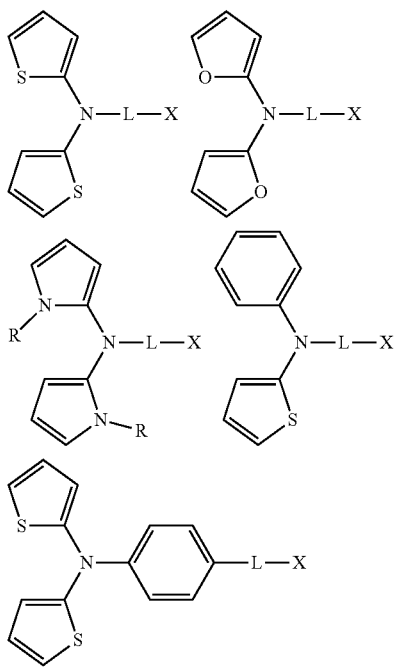

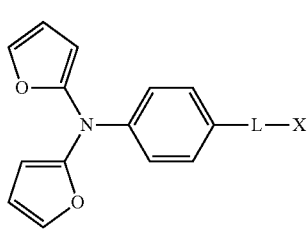

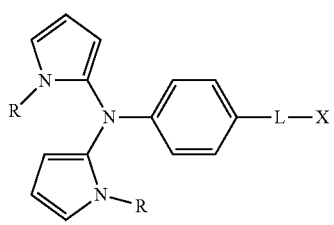

-continued

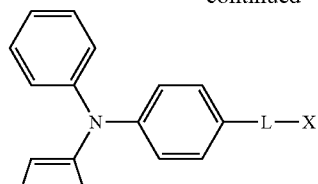

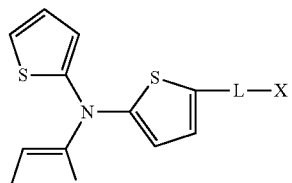

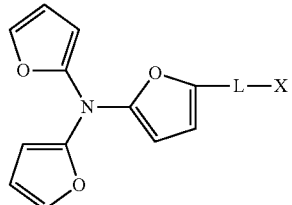

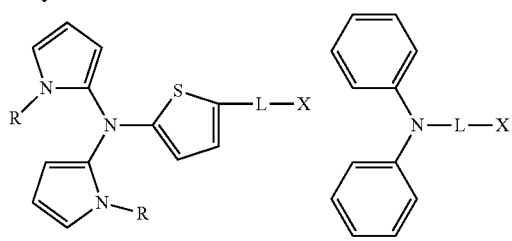

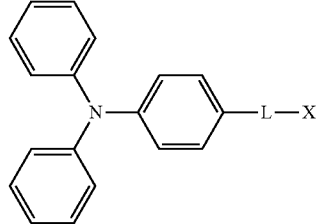

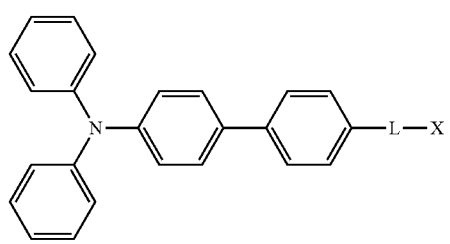

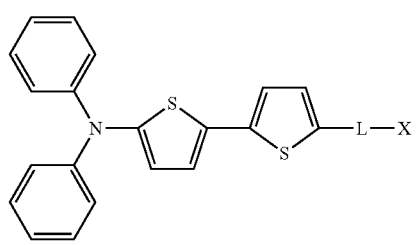

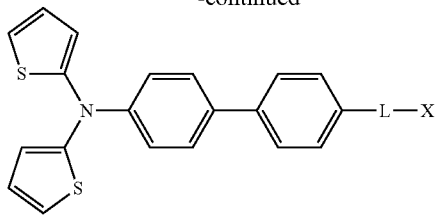

In Chemical Formula 8-1,

L and X may be the same as in Chemical Formula 1, groups R may each independently be hydrogen, a cyano group, a halogen, a C1 to C10 alkyl group, a C2 to C10 alkenyl group, a C2 to C10 alkynyl group, a C6 to C18 aryl group, or a C2 to C18 heteroaryl group, and one or more hydrogen atoms of each aromatic ring may each independently be replaced by a substituent that is a cyano group, a halogen, a C1 to C10 alkyl group, a C2 to C10 alkenyl group, a C2 to C10 alkynyl group, a C6 to C18 aryl group, or a C2 to C18 heteroaryl group.

In an embodiment, the organic ligand represented by Chemical Formula 2 may be a compound represented by Chemical Formula 8-2.

Chemical Formula 8-2

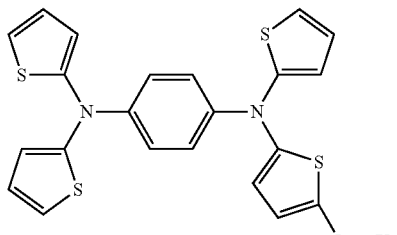

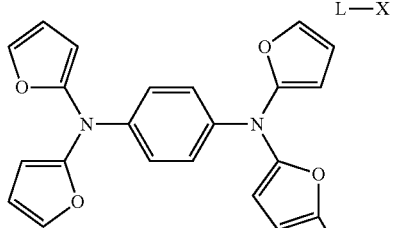

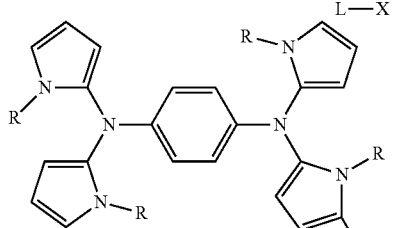

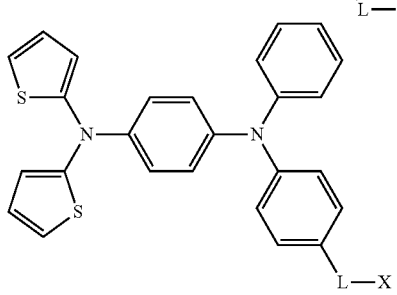

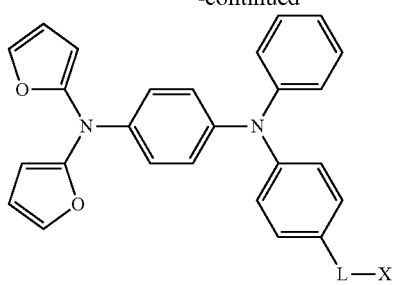

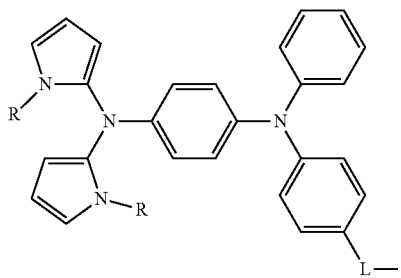

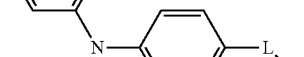
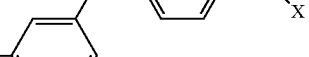

-continued

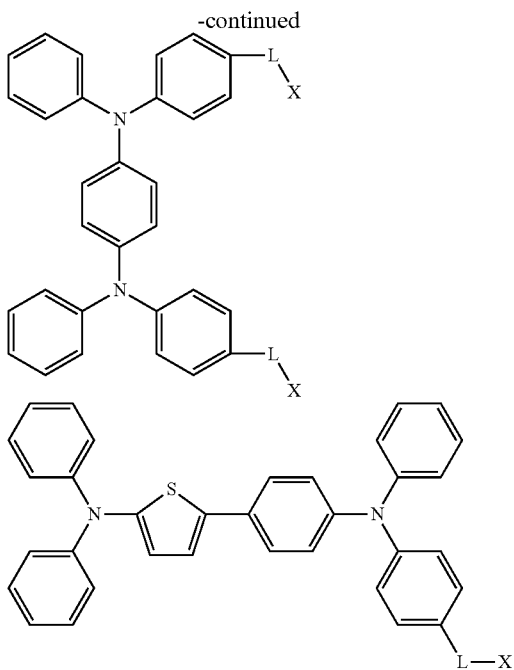

In Chemical Formula 8-2,

L and X may be the same as in Chemical Formula 2A,

R may be hydrogen, a cyano group, a halogen, a C1 to C10 alkyl group, a C2 to C10 alkenyl group, a C2 to C10 alkynyl group, a C6 to C18 aryl group, or a C2 to C18 heteroaryl group, and one or more hydrogen atoms of each aromatic ring may each independently be replaced by a substituent that is a cyano group, a halogen, a C1 to C10 alkyl group, a C2 to C10 alkenyl group, a C2 to C10 alkynyl group, a C6 to C18 aryl group, or a C2 to C18 heteroaryl group.

The ligand layer may further include at least one second organic ligand that is RCOOH, $RNH_2$, $R_2NH$, $R_3N$, RSH, $RH_2PO$, $R_2HPO$, $R_3PO$, $RH_2P$, $R_2HP$, $R_3P$, ROH, RCOOR', $RPO(OH)_2$, or $R_2POOH$ (wherein, R and R' may each independently be a substituted or unsubstituted C1 to C24 alkyl group, a substituted or unsubstituted C2 to C24 alkenyl group, or a substituted or unsubstituted C2 to C24 alkynyl group).

The second organic ligand may be included in an amount of greater than or equal to about 10 parts by weight, greater than or equal to about 15 parts by weight, greater than or equal to about 20 parts by weight, or greater than or equal to about 25 parts by weight and less than or equal to about 100 parts by weight, less than or equal to about 95 parts by weight, less than or equal to about 90 parts by weight, or less than or equal to about 85 parts by weight, based on 100 parts by weight of the ligand of the semiconductor nanocrystal-ligand composite.

Specific examples of the second organic ligand may be a thiol compound such as methane thiol, ethane thiol, propane thiol, butane thiol, pentane thiol, hexane thiol, octane thiol, dodecane thiol, hexadecane thiol, octadecane thiol, benzyl thiol, and the like; amines such as methane amine, ethane amine, propane amine, butane amine, pentyl amine, hexyl amine, octyl amine, nonylamine, decylamine, dodecyl amine, hexadecyl amine, octadecyl amine, dimethyl amine, diethyl amine, dipropyl amine, tributylamine, trioctylamine, and the like; a carboxylic acid compound such as methanoic acid, ethanoic acid, propanoic acid, butanoic acid, pentanoic acid, hexanoic acid, heptanoic acid, octanoic acid, dodecanoic acid, hexadecanoic acid, octadecanoic acid, oleic acid, benzoic acid, and the like; a phosphine compound such as methyl phosphine, ethyl phosphine, propyl phosphine, butyl phosphine, pentyl phosphine, octylphosphine, dioctyl phosphine, tributylphosphine, trioctylphosphine, diphenyl phosphine, triphenyl phosphine, and the like; a phosphine oxide compound such as methyl phosphine oxide, ethyl phosphine oxide, propyl phosphine oxide, butyl phosphine oxide, pentyl phosphine oxide, tributylphosphine oxide, octylphosphine oxide, dioctyl phosphine oxide, trioctylphosphine oxide; diphenyl phosphine oxide, triphenyl phosphine oxide, and the like; a C5 to C20 alkyl phosphinic acid such as hexylphosphinic acid, octylphosphinic acid, dodecanephosphinic acid, tetradecanephosphinic acid, hexadecanephosphinic acid, octadecanephosphinic acid; a C5 to C20 alkyl phosphonic acid, and the like; but are not limited thereto.

The semiconductor nanocrystal-ligand composite may further include a polyvalent metal compound.

The polyvalent metal compound may include a metal that is Zn, In, Ga, Mg, Ca, Sc, Sn, Ti, V, Cr, Mn, Fe, Co, Ni, Cu, Sr, Y, Zr, Nb, Mo, Cd, Ba, Au, Ag, Pb, Hg, Tl, or a combination thereof.

The polyvalent metal compound may be an organometallic compound, an organic salt, an inorganic salt, or a combination thereof. The polyvalent metal compound may include a metal halide, metal C1 to C30 alkyl, a metal C1 to C30 carboxylate such as a metal C1 to C30 acetate, a metal C1 to C30 (meth)acrylate, a metal dialkyldithiocarbamate, a metal chalcogenide, or a combination thereof. Herein, the alkyl may be C1 to C20 alkyl, for example, C1 to C20 alkyl or C1 to C10 alkyl.

The metal halide may be a metal chloride, a metal bromide, or metal iodide. The polyvalent metal compound may be a metal chloride such as zinc chloride, indium chloride, cadmium chloride, aluminum chloride, iron chloride, or manganese chloride; metal alkyl such as diethyl zinc, dipropyl zinc, dibutyl zinc, triethylaluminum, tributylaluminum; an organometallic compound such as a zinc carboxylate, for example a zinc acetate, a zinc acrylate, a zinc diethyl dithiocarbamate, or an indium acetate, or a combination thereof.

The polyvalent metal compound may be included in an amount of greater than or equal to about 50 parts by weight, greater than or equal to about 55 parts by weight, greater than or equal to about 60 parts by weight, or greater than or equal to about 65 parts by weight, and less than or equal to about 200 parts by weight, less than or equal to about 190 parts by weight, less than or equal to about 180 parts by weight, or less than or equal to about 170 parts by weight, based on 100 parts by weight of the semiconductor nanocrystal-ligand composite (i.e., a composite without the polyvalent metal compound). The luminous efficiency characteristic may be improved in these ranges.

In the semiconductor nanocrystal-ligand composite, the semiconductor nanocrystal may be a Group II-VI compound, a Group III-V compound, a Group IV-VI compound, a Group IV element or compound, a Group I-III-VI compound, a Group I-II-IV-VI compound, or a combination thereof. The semiconductor nanocrystal may not include (i.e., exclude) cadmium, lead, or a combination thereof.

The Group II-VI compound may be a binary element compound such as CdSe, CdTe, ZnS, ZnSe, ZnTe, ZnO, HgS, HgSe, HgTe, MgSe, MgS, or a combination thereof; a ternary element compound such as CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, or a combination thereof; and a quaternary element compound such as HgZnTeS, CdZnSeS, CdZnSeTe, CdZnSTe, CdHgSeS, CdHgSeTe, CdHgSTe, ZnSeSTe, HgZnSeS, HgZnSeTe, HgZnSTe, or a combination thereof. The Group II-VI compound may further include a Group III metal.

The Group III-V compound may be a binary element compound such as GaN, GaP, GaAs, GaSb, AlN, AlP, AlAs, AlSb, InN, InP, InAs, InSb, or a combination thereof; a ternary element compound such as GaNP, GaNAs, GaNSb, GaPAs, GaPSb, AlNP, AlNAs, AlNSb, AlPAs, AlPSb, InNP, InNAs, InNSb, InPAs, InPSb, and a combination thereof; and a quaternary element compound such as GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, InZnP, and a combination thereof. The Group III-V compound may further include a Group II metal (e.g., InZnP).

The IV-VI compound may be a binary element compound such as SnS, SnSe, SnTe, PbS, PbSe, PbTe, and a combination thereof; a ternary element compound such as SnSeS, SnSeTe, SnSTe, PbSeS, PbSeTe, PbSTe, SnPbS, SnPbSe, SnPbTe, or a combination thereof; and a quaternary element compound such as SnPbSSe, SnPbSeTe, SnPbSTe, or a combination thereof.

Examples of the Group I-III-VI compound may include CuInSe$_2$, CuInS$_2$, CuInGaSe, and CuInGaS, but are not limited thereto. Examples of the Group I-II-IV-VI compound may include CuZnSnSe and CuZnSnS, but are not limited thereto.

The Group IV element or compound may be a single element material such as Si, Ge, or a combination thereof; or a binary element compound such as SiC, SiGe, or a combination thereof.

The binary element compound, the ternary element compound, or the quaternary element compound may be respectively included in the particle at a uniform concentration or at partially different concentrations.

The semiconductor nanocrystal may have a core/shell structure wherein a second semiconductor nanocrystal having a different composition from a first semiconductor nanocrystal is disposed on a core including the first semiconductor nanocrystal. An alloy interlayer may exist or may not exist on the interface between the core and the shell. When the alloy interlayer is present, the interface between the core and the shell may have a concentration gradient wherein a concentration of an element of the shell is changed in a radial direction (e.g., increased or decreased toward the core). The shell may include a multi-layered shell having at least two layers. In the multi-layered shell, each layer may have a single composition or a composition having an alloy or a concentration gradient, but is not limited thereto.

In the core-shell semiconductor nanocrystal, the shell may have a larger energy bandgap than the core or vice versa. In the multi-layered shell, an outer shell of a core may have a greater energy bandgap than a shell near to a core, but is not limited thereto.

The semiconductor nanocrystal may have a size (a particle diameter or in the case of non-spherically shaped particle, a longest diameter, as calculated from a two-dimensional area confirmed by an electron microscopy analysis) of about 1 nanometer (nm) to about 100 nm. In an embodiment, the semiconductor nanocrystal may have a particle diameter (the longest diameter for a non-spherically shaped particle) of about 1 nm to about 20 nm, for example about 2 nm to about 15 nm, or about 3 nm to about 15 nm.

In an embodiment, the semiconductor nanocrystal may have a particle diameter of greater than or equal to about 2 nm, greater than or equal to about 3 nm, greater than or equal to about 4 nm, or greater than or equal to about 5 nm. The semiconductor nanocrystal may have a particle diameter of less than or equal to about 50 nm, less than or equal to about 45 nm, less than or equal to about 40 nm, less than or equal to about 35 nm, less than or equal to about 30 nm, less than or equal to about 25 nm, less than or equal to about 20 nm, less than or equal to about 15 nm, less than or equal to about 10 nm, less than or equal to about 9 nm, less than or equal to about 8 nm, or less than or equal to about 7 nm.

In addition, a shape of the semiconductor nanocrystal may be any shape in this art but is not particularly limited. For example, the semiconductor nanocrystal may have a spherical, oval, pyramidal, multi-armed, or cube nanoparticle, nanotube, nanowire, nanofiber, nanosheet, or a combination thereof.

In addition, the semiconductor nanocrystal may be commercially available or may be synthesized by any method. For example, a plurality of nano-sized semiconductor nanocrystals may be synthesized by a wet chemical process and may be provided in a form of a semiconductor nanocrystal dispersion. In the wet chemical process, precursor materials react in an organic solvent to grow crystal particles and the organic solvent or a ligand compound may naturally coordinate the surface of the semiconductor nanocrystal, controlling the growth of the crystal. Examples of the organic solvent and the ligand compound are known. The organic solvent coordinated on the surface of the semiconductor nanocrystal may affect stability of a device, and thus excess organic materials that are not coordinated on the surface of the semiconductor nanocrystals may be removed by pouring it in excessive non-solvent, and centrifuging the resulting mixture. Examples of the non-solvent may be acetone, ethanol, methanol, and the like, but are not limited thereto.

The semiconductor nanocrystal-ligand composite may be prepared through a ligand substitution reaction by adding the compound represented by Chemical Formula 1, the compound represented by Chemical Formula 2, or a combination thereof to the synthesized semiconductor nanocrystal dispersion. Through this ligand substitution process, the organic ligand compound may be coordinated on the surface of the semiconductor nanocrystals. The ligand substitution process may be performed at about 40° C. to about 150° C., for example, about 50° C. to about 140° C. After the ligand substitution process, the semiconductor nanocrystal-ligand composite is added to an organic solvent such as alcohol and the like and then, centrifuged to remove the non-coordinated compound.

According to another embodiment, an electronic device includes the semiconductor nanocrystal-ligand composite. The electronic device may include a light emitting device such as an organic light emitting diode (OLED), a quantum dot LED (QD LED), and the like, a sensor, an image sensor, a solar cell, or a display device such as a liquid crystal display (LCD) device, and the like, but is not limited thereto.

In an embodiment, the electronic device may be a photoluminescent device (e.g., a lighting device such as a quantum dot sheet or a quantum dot rail or a liquid crystal display (LCD)) or an electroluminescent device (e.g., QD LED). In a non-limiting embodiment, the electronic device may include a quantum dot sheet and the semiconductor nanocrystal particle may be included in the quantum dot sheet (e.g., in a form of a semiconductor nanocrystal-polymer composite).

In a non-limiting embodiment, the electronic device may be a light emitting device.

Hereinafter, referring to FIG. 1, a light emitting device according to an embodiment is described. FIG. 1 is a schematic cross-sectional view of a light emitting device according to an embodiment. Referring to FIG. 1, a light emitting device 10 includes an anode 11 and a cathode 15 facing each other and an emission layer 13 disposed between the anode 11 and the cathode 15, and the emission layer 13 may include the aforementioned semiconductor nanocrystal-ligand composite. As shown in FIG. 1, the anode 11 may be an anode layer and the cathode 15 may be a cathode layer.

The anode 11 may include a hole injection conductor having a relatively high work function. The cathode 15 may include an electron injection conductor having a low work function. The electron/hole injection conductor may include a metal-containing material such as aluminum, magnesium, tungsten, nickel, cobalt, platinum, palladium, calcium, LiF, and the like (e.g., a metal, a metal compound, an alloy, or a combination thereof), a metal oxide such as gallium indium oxide or indium tin oxide, or a conductive polymer having a relatively high work function such as polyethylene dioxythiophene, but is not limited thereto.

At least one of the anode 11 and the cathode 15 may be a light transmitting electrode or a transparent electrode. In an embodiment, both of the anode 11 and the cathode 15 may be light transmitting electrodes. The electrode may be patterned.

The light transmitting electrode may be made of, for example a transparent conductor such as indium tin oxide (ITO) or indium zinc oxide (IZO), gallium indium tin oxide, zinc indium tin oxide, titanium nitride, polyaniline, or LiF/Mg:Ag, or a metal thin film of a thin monolayer or multi-layer but is not limited thereto. When one of the anode 11 and the cathode 15 is a non-light transmitting electrode, it may be made of, for example, an opaque conductor such as aluminum (Al), a lithium aluminum (Li:Al) alloy, a magnesium-silver alloy (Mg:Ag), or a lithium fluoride-aluminum (LiF:Al).

The light transmitting electrode may be disposed on a transparent substrate (e.g., insulating transparent substrate). The substrate may be rigid or flexible. The substrate may be a plastic, glass, or a metal.

Thicknesses of the anode 11 and the cathode 15 are not particularly limited and may be appropriately selected considering device efficiency. For example, the thicknesses of each of the anode 11 and the cathode 15 may be independently greater than or equal to about 5 nm, for example, greater than or equal to about 50 nm and less than or equal to about 100 μm, for example, less than or equal to about 10 μm, or less than or equal to about 1 μm, less than or equal to about 900 nm, less than or equal to about 500 nm, or less than or equal to about 100 nm, but are not limited thereto.

The emission layer 13 includes a plurality of semiconductor nanocrystal-ligand composites. The emission layer 13 may include a monolayer of the plurality of semiconductor nanocrystal-ligand composites.

Figure 2:
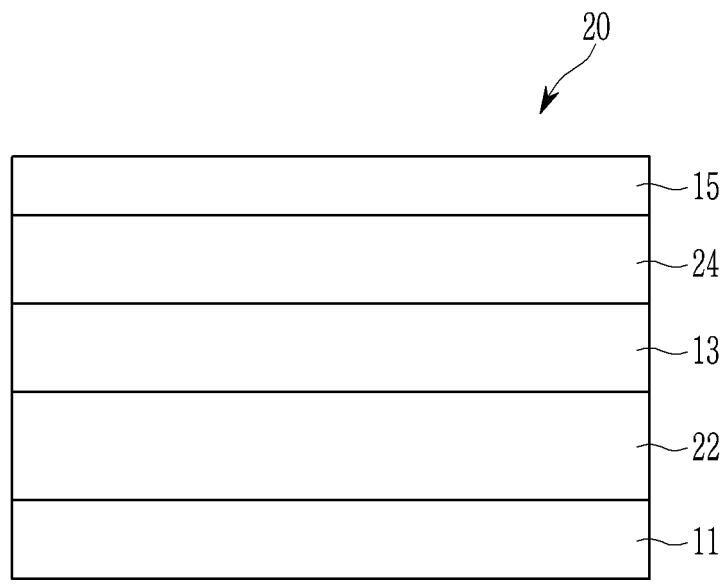
FIG. 2 is a schematic cross-sectional view showing a light emitting device according to another embodiment.

Referring to FIG. 2, a light emitting device according to another embodiment is described. FIG. 2 is a schematic cross-sectional view of a light emitting device according to another embodiment. The light emitting device 20 may include a charge (hole or electron) auxiliary layer between the anode 11 and the cathode 15. For example, the light emitting device may include a hole auxiliary layer 22 or an electron auxiliary layer 24 between the anode 11 and the emission layer 13 and/or between the cathode 15 and the emission layer 13. As shown in FIG. 2, the anode 11 may be an anode layer and the cathode 15 may be a cathode layer.

The hole auxiliary layer 22 may include for example a hole injection layer (HIL) to facilitate hole injection, a hole transport layer (HTL) to facilitate hole transport, an electron blocking layer (EBL) to inhibit electron transport, or a combination thereof. For example, the hole injection layer may be disposed between the hole transport layer and the anode. For example, the electron blocking layer may be disposed between the emission layer and the hole transport (injection) layer but is not limited thereto. A thickness of each layer of the hole auxiliary layer 22 may be appropriately selected. For example, each thickness of the layer may be greater than or equal to about 1 nm and less than or equal to about 500 nm but is not limited thereto. The hole injection layer may be an organic layer that is formed by a solution process (e.g., spin coating etc.) such as PEDOT:PSS. The hole transport layer may be an organic layer that is formed by a solution process (e.g., spin coating etc.).

The electron auxiliary layer may include for example an electron injection layer (EIL) to facilitate electron injection, an electron transport layer (ETL) to facilitate electron transport, a hole blocking layer (HBL) to inhibit hole transport, or a combination thereof. For example, the electron injection layer may be disposed between the electron transport layer and the cathode. For example, the hole blocking layer may be disposed between the emission layer and the electron transport (injection) layer but is not limited thereto. A thickness of each layer may be appropriately selected. For example, each thickness of the layer may be greater than or equal to about 1 nm and less than or equal to about 500 nm but is not limited thereto. The electron injection layer may be an organic layer formed by deposition. The electron transport layer may include an inorganic oxide nanoparticle or may be an organic layer formed by deposition.

The emission layer may be disposed in the hole injection (or transport) layer or an electron injection (or transport) layer. The emission layer may be disposed as a separate layer between the hole auxiliary layer and the electron auxiliary layer.

The charge auxiliary layer may include for example an organic material, an inorganic material, or an organic/inorganic material. The organic material may be a compound having hole or electron-related properties. The inorganic material may be for example a metal oxide such as molybdenum oxide, tungsten oxide, zinc oxide, or nickel oxide, but is not limited thereto.

In an embodiment, the hole transport layer (HTL) may include, for example at least one of poly(3,4-ethylenedioxythiophene):poly(styrenesulfonate) (PEDOT:PSS), poly(9,9-dioctyl-fluorene-co-N-(4-butylphenyl)-diphenylamine) (TFB), polyarylamine, poly(N-vinylcarbazole), polyaniline, polypyrrole, N,N,N',N'-tetrakis(4-methoxyphenyl)-benzidine (TPD), 4-bis[N-(1-naphthyl)-N-phenyl-amino]biphenyl (α-NPD), m-MTDATA (4,4',4"-tris[phenyl(m-tolyl)amino]triphenylamine), 4,4',4"-tris(N-carbazolyl)-triphenylamine (TCTA), 1,1-bis[(di-4-tolylamino)phenylcyclohexane (TAPC), p-type metal oxide (e.g., NiO, $WO_3$, $MoO_3$, etc.), a carbonaceous material such as graphene oxide, and a combination thereof, but is not limited thereto.

In an embodiment, the electron blocking layer (EBL) may include for example at least one of poly(3,4-ethylenedioxythiophene):poly(styrene sulfonate) (PEDOT:PSS), poly(9,9-dioctyl-fluorene-co-N-(4-butylphenyl)-diphenylamine) (TFB) polyarylamine, poly(N-vinylcarbazole), polyaniline, polypyrrole, N,N,N',N'-tetrakis(4-methoxyphenyl)-benzidine (TPD), 4-bis[N-(1-naphthyl)-N-phenyl-amino]biphenyl (α-NPD), m-MTDATA, 4,4',4''-tris(N-carbazolyl)-triphenylamine (TCTA), and a combination thereof, but is not limited thereto.

In an embodiment, the electron transport layer (ETL) may include for example at least one of 1,4,5,8-naphthalene-tetracarboxylic dianhydride (NTCDA), bathocuproine (BCP), tris[3-(3-pyridyl)-mesityl]borane (3TPYMB), LiF, $Alq_3$, $Gaq_3$, $Inq_3$, $Znq_2$, $Zn(BTZ)_2$, $BeBq_2$, ET204 (8-(4-(4,6-di(naphthalen-2-yl)-1,3,5-triazin-2-yl)phenyl)quinolone), 8-hydroxyquinolinato lithium (Liq), an n-type metal oxide (e.g., ZnO, $HfO_2$, etc.), $Zn_{1-x}M_xO$ (wherein, M is Mg, Ca, Zr, W, Li, Ti, or a combination thereof, and 0≤x≤0.5), or a combination thereof, but is not limited thereto.

In an embodiment, the hole blocking layer (HBL) may include for example at least one of 1,4,5,8-naphthalene-tetracarboxylic dianhydride (NTCDA), bathocuproine (BCP), tris[3-(3-pyridyl)-mesityl] borane (3TPYMB), LiF, $Alq_3$, $Gaq_3$, Inq3, Znq2, $Zn(BTZ)_2$, $BeBq_2$, and a combination thereof, but is not limited thereto.

In the light emitting device 20 of FIG. 2, the anode 11 may be disposed on a transparent substrate (not shown). Herein, the light emitting device 20 may include the anode 11 disposed on the transparent substrate; the cathode 15 facing the anode 11; the hole auxiliary layer 22 disposed between the anode 11 and the emission layer 13; and the electron auxiliary layer 24 disposed between the emission layer 13 and the cathode 15.

Alternatively, the cathode 15 may be disposed on a transparent substrate (not shown). Herein, the light emitting device 20 may include a cathode 15 disposed on a transparent substrate; an anode 11 facing the cathode 15; the hole auxiliary layer 22 disposed between the anode 11 and an emission layer 13; and the electron auxiliary layer 24 disposed between the emission layer 13 and the cathode 15.

In another embodiment, the light emitting device may have an inverted structure. Herein, the cathode disposed on a transparent substrate may include a metal oxide-based transparent electrode (e.g., ITO) and the anode facing the cathode may include a metal (e.g., Au, Ag, etc.) of a relatively high work function. For example, an n-type metal oxide (ZnO) may be disposed between the transparent electrode and the emission layer as an electron auxiliary layer (e.g., an electron transport layer (ETL)). $MoO_3$ or another p-type metal oxide as a hole auxiliary layer (e.g., hole transport layer (HTL)) may be disposed between the metal anode and the emission layer.

Hereinafter, specific examples are illustrated. However, these examples are exemplary, and the present disclosure is not limited thereto.

EXAMPLES

Comparative Example 1

Comparative Example 1-1: Preparation of ZnTeSe Core

Selenium and tellurium are respectively dispersed in trioctylphosphine (TOP) to obtain a 2 moles per liter (molar, M) Se/TOP solution and a 0.1 M Te/TOP solution. A 1 M diethylzinc hexane solution is obtained. The Se/TOP solution, the Te/TOP solution, and the diethylzinc hexane solution are mixed to prepare a precursor mixed solution. In the precursor mixed solution, each amount of Se and Te per 1 mole (mol) of zinc is adjusted respectively into 0.8 mol and 0.03 mol.

Separately, trioctylamine is put in a 300 mL reaction flask, oleic acid (OA) and hexadecylamine (HDA) are respectively added thereto in an amount of 2.5 mol per 1 mol of a zinc precursor (i.e., diethylzinc) in the flask. After converting an atmosphere of the flask into nitrogen, the flask is heated at 280° C. for 10 minutes to obtain a heated organic ligand solution.

The above precursor mixed solution is added to the heated organic ligand solution, and the obtained mixture is heated up to 300° C. and reacted at the same temperature for 40 minutes. After the reaction, the resultant is rapidly cooled down to room temperature (25° C.), ethanol is added thereto, and the mixture is centrifuged to recover ZnSeTe core particles. The recovered ZnSeTe core particles are dispersed in toluene.

Comparative Example 1-2: Formation of ZnSeS/ZnS Shell

Trioctylamine is put in a 300 mL flask. Next, 0.6 mmol of zinc acetate and oleic acid are added thereto and then vacuum-treated at 120° C. for 10 minutes. Herein, an amount of the oleic acid is twice as much as that of the zinc acetate. After substituting inside of the flask with nitrogen ($N_2$), the reactor is heated up to 180° C. Subsequently, the ZnTeSe core particles according to Comparative Example 1-1 are rapidly added thereto (reaction time: 40 minutes), and the obtained mixture is heated up to 320° C., while Se/TOP and S/TOP are added thereto. During the reaction, Se/TOP and S/TOP are respectively once injected thereinto every 20 minutes, and in the first injection step, Se/TOP is injected in a larger amount than that of S/TOP, and in the final injection step, S/TOP is injected in a larger amount than Se/TOP. A total addition amount of Se is 0.4 millimoles (mmol), and a total addition amount of S is 0.8 mmol.

When the reaction is complete, the reactor is cooled down, ethanol is added to the reaction solution at room temperature, and the obtained mixture is centrifuged to obtain core/shell semiconductor nanocrystals. The core/shell semiconductor nanocrystals are dispersed in toluene.

Comparative Example 2

The core/shell semiconductor nanocrystals according to Comparative Example 1 are put in a centrifugal container, ethanol is added thereto, and the obtained mixture is precipitated and centrifuged. After separating floating materials therefrom, the obtained precipitate is dispersed in cyclohexane and put in a reactor, and 52 parts by weight of zinc chloride and 550 parts by weight of octane thiol 100 parts by weight of the core/shell semiconductor nanocrystals are added thereto and then, stirred at 60° C. for 30 minutes to prepare a ligand-substituted semiconductor nanocrystal-ligand composite.

Example 1

The core/shell semiconductor nanocrystals according to Comparative Example 1 are put in a centrifugal container, ethanol is added thereto, and the obtained mixture is precipitated and centrifuged. After separating floating materials therefrom, the obtained precipitate is dispersed in cyclohexane and put in a reactor, and 52 parts by weight of zinc chloride and 550 parts by weight of an organic ligand represented by Chemical Formula A based on 100 parts by weight of the core/shell semiconductor nanocrystals are added thereto and then, stirred at 40° C. for 30 minutes to substitute the ligand. The reaction solution is cooled down and put in a centrifugal container, ethanol is added thereto, and the obtained mixture is precipitated and centrifuged. After separating floating materials therefrom, the obtained precipitate is dispersed in octane to prepare a ligand-substituted semiconductor nanocrystal-ligand composite.

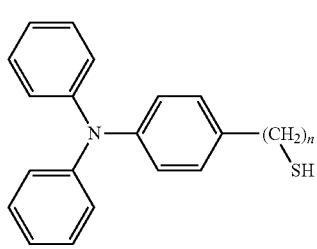

Chemical Formula A

In Chemical Formula A, n is 6.

Example 2

The core/shell semiconductor nanocrystals according to Comparative Example 1 are put in a centrifugal container, ethanol is added thereto, and the obtained mixture is precipitated and centrifuged. After separating floating materials therefrom, the obtained precipitate is dispersed in cyclohexane and put in a reactor, and 52 parts by weight of zinc chloride and 550 parts by weight of an organic ligand represented by Chemical Formula B based on 100 parts by weight of the core/shell semiconductor nanocrystals are added thereto and then, stirred at 40° C. for 30 minutes to substitute the ligand. The reaction solution is cooled down and put in a centrifugal container, ethanol is added thereto, and the obtained mixture is precipitated and centrifuged. After separating floating materials therefrom, the obtained precipitate is dispersed in octane to prepare a ligand-substituted semiconductor nanocrystal-ligand composite.

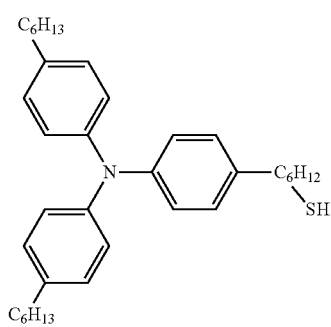

Chemical Formula B

Example 3

The nanocrystal-ligand composite of Example 2 is put in a centrifugal container, ethanol is added thereto, and the obtained mixture is precipitated and centrifuged. After separating floating materials therefrom, the obtained precipitate is dispersed in cyclohexane and put in a reactor, and 52 parts by weight of zinc chloride and 550 parts by weight of an organic ligand represented by Chemical Formula C based on 100 parts by weight of the core/shell semiconductor nanocrystals are added thereto and then, stirred at 40° C. for 30 minutes to substitute the ligand. The reaction solution is cooled down and put in a centrifugal container, ethanol is added thereto, and the obtained mixture is precipitated and centrifuged. After separating floating materials therefrom, the obtained precipitate is dispersed in octane to prepare a ligand-substituted semiconductor nanocrystal-ligand composite.

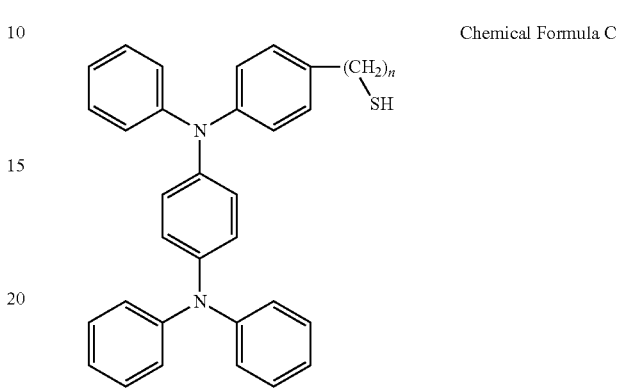

Chemical Formula C

In Chemical Formula C, n is 6.

Photoluminescence characteristics of the core/shell semiconductor nanocrystals according to Comparative Example 1 and the semiconductor nanocrystal-ligand composites according to Comparative Example 2 and Examples 1, 2, and 3 are analyzed, and the results are shown in Table 1. PL wavelengths (nm) and full widths at half maximum (FWHM, reported in nm) are analyzed by obtaining photoluminescence (PL) spectra of the nanocrystals at an excitation wavelength of 372 nm using a Hitachi F-7000 spectrometer (Hitachi, Ltd.). The results are shown in Table 1.

TABLE 1

|  | PL wavelength (nm) | Full width at half maximum (FWHM) (nm) |
| --- | --- | --- |
| Comparative Example 1 | 452 | 22 |
| Comparative Example 2 | 452 | 22 |
| Example 1 | 453 | 22 |
| Example 2 | 453 | 22 |
| Example 3 | 453 | 22 |

Referring to Table 1, photoluminescence characteristics of the semiconductor nanocrystal-ligand composites manufactured through an organic ligand substitution process according to Examples 1 to 3 turn out to receive no significant influence from the organic ligand substitution process.

Comparative Example 3: Manufacture of Light Emitting Device

ITO is deposited on a glass substrate to form an anode, PEDOT:PSS and TFB (poly(9,9-dioctyl-fluorene-co-N-(4-butylphenyl)-diphenylamine)) are spin-coated thereon to form a hole transport layer (HTL). On the hole transport layer (HTL), a dispersion of the semiconductor nanocrystal according to Comparative Example 1 is spin-coated to form an emission layer. On the emission layer, ET204 (8-(4-(4,6-di(naphthalen-2-yl)-1,3,5-triazin-2-yl)phenyl)quinolone) and Liq (8-hydroxyquinolinato lithium) are vacuum-deposited to form an electron transport layer (ETL). On the electron transport layer (ETL), Al is deposited to form a cathode and thus manufacture a light emitting device.

Comparative Example 4: Manufacture of Light Emitting Device

A light emitting device is manufactured according to the same method as Comparative Example 3 except that the semiconductor nanocrystal-ligand composite according to Comparative Example 2 is used instead of the semiconductor nanocrystal according to Comparative Example 1.

Example 4: Manufacture of Light Emitting Device

A light emitting device is manufactured according to the same method as Comparative Example 3 except that the semiconductor nanocrystal-ligand composite according to Example 1 is used instead of the semiconductor nanocrystal according to Comparative Example 1.

Example 5: Manufacture of Light Emitting Device

A light emitting device is manufactured according to the same method as Comparative Example 3 except that the semiconductor nanocrystal-ligand composite according to Example 2 is used instead of the semiconductor nanocrystal according to Comparative Example 1.

Example 6: Manufacture of Light Emitting Device

A light emitting device is manufactured according to the same method as Comparative Example 3 except that the semiconductor nanocrystal-ligand composite according to Example 3 is used instead of the semiconductor nanocrystal according to Comparative Example 1.

Maximum external quantum efficiency ($EQE_{max}$), current efficiency (candela per ampere, Cd/A), and voltages (volts, V) of the light emitting devices according to Comparative Examples 3 and 4 and Examples 4, 5, and 6 are measured by applying a voltage (0 V to 7 V) between an ITO electrode and an Al electrode thereof, and the results are shown in Table 2.

TABLE 2

|  | $EQE_{max}$ (%) | Max current efficiency (Cd/A) | Voltage (V) at 125 mA/cm² |
|---|---|---|---|
| Comparative Example 3 | 1.8 | 0.95 | 5.8 |
| Comparative Example 4 | 2.2 | 1.4 | 6.1 |
| Example 4 | 3.5 | 2.3 | 3.7 |
| Example 5 | 4.2 | 2.8 | 3.8 |
| Example 6 | 4.0 | 2.1 | 3.8 |

Referring to Table 2, the light emitting devices of Examples 4 to 6 including the semiconductor nanocrystal-ligand composites according to Example 1 to 3 show much higher external quantum efficiency and current efficiency and lower driving voltages than the light emitting device of Comparative Example 3 including the semiconductor nanocrystals having no ligand substitution process according to Comparative Example 1 and the light emitting device of Comparative Example 4 including the semiconductor nanocrystal-ligand composite according to Comparative Example 2.

While this disclosure has been described in connection with what is presently considered to be practical example embodiments, it is to be understood that the disclosure is not limited to the exemplary embodiments. On the contrary, it is intended to cover various modifications and equivalent arrangements included within the spirit and scope of the appended claims.

What is claimed is:

1. A semiconductor nanocrystal-ligand composite, comprising
a semiconductor nanocrystal and a ligand layer comprising an organic ligand coordinated on a surface of the semiconductor nanocrystal,
wherein the organic ligand comprises a compound represented by Chemical Formula 1, a compound represented by Chemical Formula 2, or a combination thereof:

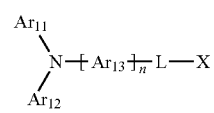

Chemical Formula 1 wherein, in Chemical Formula 1,
$Ar_{11}$ and $Ar_{12}$ are each independently a substituted or unsubstituted C6 to C20 aryl group; a substituted or unsubstituted C2 to C20 heteroaryl group; or at least two aromatic ring groups linked by a linker wherein each aromatic ring group is one of the substituted or unsubstituted C6 to C20 aryl group and the substituted or unsubstituted C2 to C20 heteroaryl group,
$Ar_{13}$ is a substituted or unsubstituted C6 to C18 arylene group; a substituted or unsubstituted C2 to C18 heteroarylene group; or at least two aromatic ring groups linked by a linker wherein each aromatic ring group is one of the substituted or unsubstituted C6 to C18 arylene group and the substituted or unsubstituted C2 to C18 heteroarylene group,
n is an integer ranging from 0 to 3,
L is a substituted or unsubstituted C1 to C30 alkylene group; or a substituted or unsubstituted C1 to C30 alkylene group comprising at least one linker that is —O—, —NR$^a$—, —C(=O)—, —OC(=O)—, —C(=O)O—, —S(=O)$_2$—, —Si(R$^b$R$^c$)$_2$—, —C(=O)NR$^d$—, —C(R$^e$)=C(R$^f$)—, or —C≡C—, wherein, R$^a$, R$^b$, R$^c$, R$^d$, R$^e$, and R$^f$ are each independently hydrogen, a cyano group, a halogen, a C1 to C10 alkyl group, a C2 to C10 alkenyl group, a C2 to C10 alkynyl group, a C6 to C18 aryl group, or a C2 to C18 heteroaryl group, and
X is a functional group bound to the surface of the semiconductor nanocrystal,

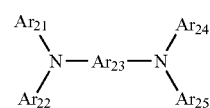

Chemical Formula 2 wherein, in Chemical Formula 2,
$Ar_{21}$, $Ar_{22}$, $Ar_{24}$, and $Ar_{25}$ are each independently a substituted or unsubstituted C6 to C20 aryl group; a substituted or unsubstituted C2 to C20 heteroaryl group; or at least two aromatic ring groups linked by a linker wherein each aromatic ring group is one of the substituted or unsubstituted C6 to C20 aryl group and the substituted or unsubstituted C2 to C20 heteroaryl group,
$Ar_{23}$ is a substituted or unsubstituted C6 to C18 arylene group; a substituted or unsubstituted C2 to C18 heteroarylene group; or at least two aromatic ring groups linked by a linker wherein each aromatic ring group is one of the substituted or unsubstituted C6 to C18 arylene group and the substituted or unsubstituted C2 to C18 heteroarylene group, and at least one of $Ar_{21}$, $Ar_{22}$, $Ar_{24}$, and $Ar_{25}$ has a functional group represented by Chemical Formula 2A:

*-L-X      Chemical Formula 2A wherein, in Chemical Formula 2A,

L is a substituted or unsubstituted C1 to C30 alkylene group; or a substituted or unsubstituted C1 to C30 alkylene group comprising at least one linker that is —O—, —NR$^a$—, —C(=O)—, —OC(=O)—, —C(=O)O—, —S(=O)$_2$—, —Si(R$^b$R$^c$)$_2$—, —C(=O)NR$^d$—, —C(R$^e$)=C(R$^f$)—, or —C≡C—, wherein, R$^a$, R$^b$, R$^c$, R$^d$, R$^e$, and R$^f$ are each independently hydrogen, a cyano group, a halogen, a C1 to C10 alkyl group, a C2 to C10 alkenyl group, a C2 to C10 alkynyl group, a C6 to C18 aryl group, or a C2 to C18 heteroaryl group, and X is a functional group bound to the surface of the semiconductor nanocrystal.

2. The semiconductor nanocrystal-ligand composite of claim 1, wherein $Ar_{11}$ and $Ar_{12}$ of Chemical Formula 1 and $Ar_{21}$, $Ar_{22}$, $Ar_{24}$, and $Ar_{25}$ of Chemical Formula 2 are each independently a phenyl group, a naphthyl group, an anthryl group, a phenanthryl group, a pyrenyl group, a perylenyl group, a fluorenyl group, a pentalenyl group, a pyrazolyl group, an imidazolyl group, a thiazolyl group, a triazolyl group, a carbazolyl group, a pyridyl group, a pyridazinyl group, a pyridmidyl group, a pyrazinyl group, a triazinyl group, an indazolyl group, an indolizinyl group, a benzimidazolyl group, a benzthiazolyl group, a benzothiophenyl group, a benzopurinyl group, an isoquinolinyl group, or a purinyl group.

3. The semiconductor nanocrystal-ligand composite of claim 1, wherein the functional group X is a thiol group, an amine group, an amide group, an imine group, an imide group, a carboxyl group, a sulfonic acid group, —PRR' wherein R and R' are each independently hydrogen or a C1 to C10 alkyl group, —PR$_{3-x}$M$_x$ wherein R is hydrogen or a C1 to C10 alkyl group and M is a trivalent metal, —PO(OR)$_2$ wherein each R is independently hydrogen or a C1 to C10 alkyl group, —OP(O)Cl$_2$, —POCl$_2$, —Si(OH)$_3$, —SiCl$_3$, —Si(OR)$_3$ wherein each OR is independently a C1 to C10 alkoxy group, a hydroxy group, —C(O)R wherein R is a halogen or a C1 to C10 alkyl group, —SO$_2$Cl, or a nitro group.

4. The semiconductor nanocrystal-ligand composite of claim 1, wherein the organic ligand is compound represented by Chemical Formula 3:

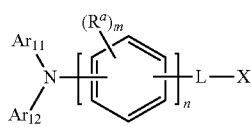

Chemical Formula 3 wherein, in Chemical Formula 3, $Ar_{11}$ and $Ar_{12}$ are each independently a substituted or unsubstituted C6 to C20 aryl group; a substituted or unsubstituted C2 to C20 heteroaryl group; or at least two aromatic ring groups linked by a linker wherein each aromatic ring group is one of the substituted or unsubstituted C6 to C20 aryl group and the substituted or unsubstituted C2 to C20 heteroaryl group, each R$^a$ is the same or different, and each is independently a hydrogen, a cyano group, a halogen, a C1 to C10 alkyl group, a C2 to C10 alkenyl group, a C2 to C10 alkynyl group, a C6 to C18 aryl group, or a C2 to C18 heteroaryl group, m is the same as the number of hydrogen of an aromatic ring, or when m is two or more, at least two adjacent groups R$^a$ are linked with each other to form a fused ring, L is a substituted or unsubstituted C1 to C30 alkylene group; or a substituted or unsubstituted C1 to C30 alkylene group comprising at least one linker that is —O—, —NR$^a$—, —C(=O)—, —OC(=O)—, —C(=O)O—, —S(=O)$_2$—, —Si(R$^b$R$^c$)$_2$—, —C(=O)NR$^d$—, —C(R$^e$)=C(R$^f$)—, or —C≡C—, wherein, R$^a$, R$^b$, R$^c$, R$^d$, R$^e$, and R$^f$ are each independently hydrogen, a cyano group, a halogen, a C1 to C10 alkyl group, a C2 to C10 alkenyl group, a C2 to C10 alkynyl group, a C6 to C18 aryl group, or a C2 to C18 heteroaryl group, n is an integer ranging from 0 to 3, and X is a functional group bound to the surface of the semiconductor nanocrystal.

5. The semiconductor nanocrystal-ligand composite of claim 1, wherein the organic ligand is compound represented by Chemical Formula 4:

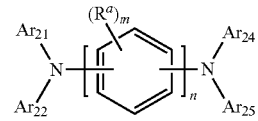

Chemical Formula 4 wherein, in Chemical Formula 4, $Ar_{21}$, $Ar_{22}$, $Ar_{24}$, and $Ar_{25}$ are each independently a substituted or unsubstituted C6 to C20 aryl group; a substituted or unsubstituted C2 to C20 heteroaryl group; or at least two aromatic ring groups linked by a linker wherein each aromatic ring group is one of the substituted or unsubstituted C6 to C20 aryl group and the substituted or unsubstituted C2 to C20 heteroaryl group, each R$^a$ is the same or different, and is hydrogen, a cyano group, a halogen, a C1 to C10 alkyl group, a C2 to C10 alkenyl group, a C2 to C10 alkynyl group, a C6 to C18 aryl group, or a C2 to C18 heteroaryl group, m is the same as the number of hydrogen of an aromatic ring, or when m is two or more, at least two adjacent groups R$^a$ are linked with each other to form a fused ring, n is an integer ranging from 0 to 3, and at least one of $Ar_{21}$, $Ar_{22}$, $Ar_{24}$, and $Ar_{25}$ has a functional group represented by Chemical Formula 2A.

6. The semiconductor nanocrystal-ligand composite of claim 1, wherein the organic ligand is a compound represented by Chemical Formula 5

Chemical Formula 5

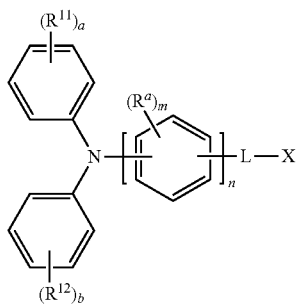

wherein, in Chemical Formula 5, $R^{11}$ and $R^{12}$ are each independently hydrogen, a C1 to C10 alkyl group, a C2 to C10 alkenyl group, a C2 to C10 alkynyl group, a C6 to C18 aryl group, or a C2 to C18 heteroaryl group, a and b are each independently an integer ranging from 0 to 5, when each of a and b are 2 or more, adjacent two functional groups of a plurality of groups $R^1$ and groups $R^{12}$ are linked with each other to form a fused ring, each $R^a$ is the same or different, and each is independently hydrogen, a cyano group, a halogen, a C1 to C10 alkyl group, a C2 to C10 alkenyl group, a C2 to C10 alkynyl group, a C6 to C18 aryl group, or a C2 to C18 heteroaryl group, m is the same as the number of hydrogen of an aromatic ring, or when m is two or more, at least two adjacent groups $R^a$ are linked with each other to form a fused ring, L is a substituted or unsubstituted C1 to C30 alkylene group; or a substituted or unsubstituted C1 to C30 alkylene group comprising at least one linker that is —O—, —NR$^a$—, —C(=O)—, —OC(=O)—, —C(=O)O—, —S(=O)$_2$—, —Si(R$^b$R$^c$)$_2$—, —C(=O)NR$^d$—, —C(R$^e$)=C(R$^f$)—, or —C≡C—, wherein, R$^a$, R$^b$, R$^c$, R$^d$, R$^e$, and R$^f$ are each independently hydrogen, a cyano group, a halogen, a C1 to C10 alkyl group, a C2 to C10 alkenyl group, a C2 to C10 alkynyl group, a C6 to C18 aryl group, or a C2 to C18 heteroaryl group, n is an integer ranging from 0 to 3, and X is a functional group bound to the surface of the semiconductor nanocrystal.

7. The semiconductor nanocrystal-ligand composite of claim 1, wherein the organic ligand is represented by Chemical Formula 6:

Chemical Formua 6

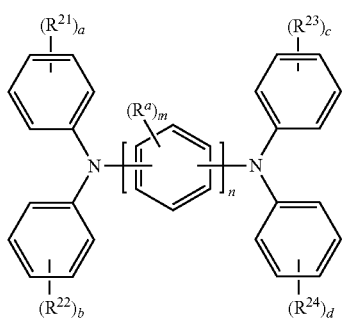

wherein, in Chemical Formula 6, $R^{21}$ to $R^{24}$ are each independently hydrogen, a cyano group, a halogen, a C1 to C10 alkyl group, a C2 to C10 alkenyl group, a C2 to C10 alkynyl group, a C6 to C18 aryl group, or a C2 to C18 heteroaryl group, a, b, c, and d are each independently an integer ranging from 0 to 5, when each of a, b, c, and d are 2 or more, at least two adjacent functional groups of a plurality of groups $R^{21}$ to $R^{24}$ are linked with each other to form a fused ring, each $R^a$ is the same or different, and each is independently hydrogen, a cyano group, a halogen, a C1 to C10 alkyl group, a C2 to C10 alkenyl group, a C2 to C10 alkynyl group, a C6 to C18 aryl group, or a C2 to C18 heteroaryl group, m is the same as the number of hydrogen of an aromatic ring, or when m is two or more, at least two adjacent groups $R^a$ are linked with each other to form a fused ring, L is a substituted or unsubstituted C1 to C30 alkylene group; or a substituted or unsubstituted C1 to C30 alkylene group comprising at least one linker that is —O—, —NR$^a$—, —C(=O)—, —OC(=O)—, —C(=O)O—, —S(=O)$_2$—, —Si(R$^b$R$^c$)$_2$—, —C(=O)NR$^d$—, —C(R$^e$)=C(R$^f$)—, or —C≡C—, wherein, R$^a$, R$^b$, R$^c$, R$^d$, R$^e$, and R$^f$ are each independently hydrogen, a cyano group, a halogen, a C1 to C10 alkyl group, a C2 to C10 alkenyl group, a C2 to C10 alkynyl group, a C6 to C18 aryl group, or a C2 to C18 heteroaryl group, n is an integer ranging from 0 to 3, and X is a functional group bound to the surface of the semiconductor nanocrystal.

8. The semiconductor nanocrystal-ligand composite of claim 1, wherein the ligand layer further comprises at least one second organic ligand that is RCOOH, RNH$_2$, R$_2$NH, R$_3$N, RSH, RH$_2$PO, R$_2$HPO, R$_3$PO, RH$_2$P, R$_2$HP, R$_3$P, ROH, RCOOR', RPO(OH)$_2$, or R$_2$POOH, wherein, R and R' are each independently a substituted or unsubstituted C1 to C24 alkyl group, a substituted or unsubstituted C2 to C24 alkenyl group, or a substituted or unsubstituted C2 to C24 alkynyl group.

9. The semiconductor nanocrystal-ligand composite of claim 1, wherein the semiconductor nanocrystal comprises a Group II-VI compound, a Group III-V compound, a Group IV-VI compound, a Group IV element or compound, a Group I-III-VI compound, a Group I-II-IV-VI compound, or a combination thereof.

10. The semiconductor nanocrystal-ligand composite of claim 1, wherein the semiconductor nanocrystal-ligand composite further comprises a polyvalent metal compound.

11. The semiconductor nanocrystal-ligand composite of claim 10, wherein the polyvalent metal compound comprises Zn, In, Ga, Mg, Ca, Sc, Sn, Ti, V, Cr, Mn, Fe, Co, Ni, Cu, Sr, Y, Zr, Nb, Mo, Cd, Ba, Au, Ag, Pb, Hg, TI, or a combination thereof.

12. The semiconductor nanocrystal-ligand composite of claim 10, wherein the polyvalent metal compound comprises an organometallic compound, an organic salt, an inorganic salt, and a combination thereof.

13. The semiconductor nanocrystal-ligand composite of claim 10, wherein the polyvalent metal compound is a metal halide, a metal C1 to C20 alkyl, a metal C1 to C20 carboxylate, a metal C3 to C20 (meth)acrylate, a metal dialkyldithiocarbamate, a metal chalcogenide, or a combination thereof.

14. An electronic device, comprising
a first electrode and a second electrode facing each other; and an emission layer disposed between the first electrode and the second electrode and comprising a plurality of semiconductor nanocrystals, wherein the plurality of semiconductor nanocrystals comprises the semiconductor nanocrystal-ligand composite of claim 1.

15. The electronic device of claim 14, wherein the electronic device is a light emitting diode, an organic light emitting diode, a sensor, an imaging sensor, a solar cell, or a liquid crystal display device.

\* \* \* \* \*